United States Patent
Li

(10) Patent No.: US 12,056,459 B2
(45) Date of Patent: Aug. 6, 2024

(54) COMPUTE IN MEMORY ARCHITECTURE AND DATAFLOWS FOR DEPTH-WISE SEPARABLE CONVOLUTION

(71) Applicant: QUALCOMM Incorporated, San Diego, CA (US)

(72) Inventor: Ren Li, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 676 days.

(21) Appl. No.: 17/367,151

(22) Filed: Jul. 2, 2021

(65) Prior Publication Data

US 2023/0004350 A1    Jan. 5, 2023

(51) Int. Cl.
| | |
|---|---|
| *G06G 7/16* | (2006.01) |
| *G06F 7/50* | (2006.01) |
| *G06F 7/523* | (2006.01) |
| *G06F 7/544* | (2006.01) |
| *G06N 3/04* | (2023.01) |
| *G06N 3/08* | (2023.01) |
| *G11C 11/412* | (2006.01) |

(52) U.S. Cl.
CPC ............... *G06F 7/523* (2013.01); *G06F 7/50* (2013.01); *G06G 7/16* (2013.01); *G06F 7/5443* (2013.01); *G06N 3/04* (2013.01); *G06N 3/08* (2013.01); *G11C 11/412* (2013.01)

(58) Field of Classification Search
CPC ... G06G 7/16; G06F 17/15–153; G06F 7/523; G06F 7/50; G06F 7/5443; G06F 7/44–443; G06F 15/7821; G06F 15/785; G06N 3/04; G06N 3/045; G06N 3/0464; G06N 3/063; G06N 3/065; G06N 3/08
See application file for complete search history.

(56) References Cited

U.S. PATENT DOCUMENTS

| | | |
|---|---|---|
| 2021/0089865 A1 | 3/2021 | Wang et al. |
| 2021/0271959 A1* | 9/2021 | Chettuvetty .......... G06F 7/5443 |

(Continued)

OTHER PUBLICATIONS

P. Chi et al., "Prime: A Novel Processing-in-Memory Architecture for Neural Network Computation in ReRAM-Based Main Memory," 2016 ACM/IEEE 43rd Annual International Symposium on Computer Architecture (ISCA), Seoul, Korea (South), 2016, pp. 27-39, (Year: 2016).*

(Continued)

*Primary Examiner* — Jyoti Mehta
*Assistant Examiner* — Huy Duong
(74) *Attorney, Agent, or Firm* — QUALCOMM Incorporated

(57) ABSTRACT

Certain aspects of the present disclosure provide a method, including: storing a depthwise convolution kernel in a first one or more columns of a CIM array; storing a fused convolution kernel in a second one or more columns of the CIM array; storing pre-activations in one or more input data buffers associated with a plurality of rows of the CIM array; processing the pre-activations with the depthwise convolution kernel in order to generate depthwise output; modifying one or more of the pre-activations based on the depthwise output to generate modified pre-activations; and processing the modified pre-activations with the fused convolution kernel to generate fused output.

29 Claims, 13 Drawing Sheets

(56) References Cited

U.S. PATENT DOCUMENTS

2022/0129519 A1* 4/2022 Zheng .................... G06F 17/16
2022/0300253 A1* 9/2022 Nagamatsu ........... G06F 17/153

OTHER PUBLICATIONS

S. Angizi, Z. He and D. Fan, "DIMA: A Depthwise CNN In-Memory Accelerator," 2018 IEEE/ACM International Conference on Computer-Aided Design (ICCAD), San Diego, CA, USA, 2018, pp. 1-8, doi: 10.1145/3240765.3240799. (Year: 2018).*
International Search Report and Written Opinion—PCT/US2022/073322—ISA/EPO—Nov. 25, 2022.
Mohammadhossein O., et al., "Accelerating DNNs Inference with Predictive Layer Fusion," Proceedings of the ACM International Conference on Supercomputing, ACMPUB27, New York, NY, USA, Jun. 3, 2021, pp. 291-303, XP058531886, DOI: 10.1145/3447818.3460378 ISBN: 978-1-4503-8338-7 figures 5, 9 section 1, lines 62-64 section 3, lines 5-12 section 3.1 section 3.3, lines 13-41 section 5.1, lines 24-27 section 5.2, lines 1-11 section 5.3, lines 1-3 section 5.3, lines 20-24.
Sie S., et al., "MARS: Multi-Macro Architecture SRAM CIM-Based Accelerator with Co-designed Compressed Neural Networks," arxiv.org, Cornell University Library, 201 Olin Library Cornell University Ithaca, NY 14853, Oct. 24, 2020, 11 Pages, XP081799358, Figure 4.

* cited by examiner

COMPUTE IN MEMORY ARCHITECTURE AND DATAFLOWS FOR DEPTH-WISE SEPARABLE CONVOLUTION

INTRODUCTION

Aspects of the present disclosure relate to performing machine learning tasks and in particular to compute in memory architectures and data flows for performing depthwise separable convolutional in memory without the need for additional multiply-and-accumulate circuits.

Machine learning is generally the process of producing a trained model (e.g., an artificial neural network, a tree, or other structures), which represents a generalize fit to a set of training data that is known a priori. Applying the trained model to new data produces inferences, which may be used to gain insights into the new data. In some cases, applying the model to the new data is described as "running an inference" on the new data.

As the use of machine learning has proliferated for enabling various machine learning (or artificial intelligence) tasks, the need for more efficient processing of machine learning model data has arisen. In some cases, dedicated hardware, such as machine learning accelerators, may be used to enhance a processing system's capacity to process machine learning model data. However, such hardware requires space and power, which is not always available on the processing device. For example, "edge processing" devices, such as mobile devices, always on devices, internet of things (IoT) devices, and the like, have to balance processing capabilities with power and packaging constraints. Further, accelerators may need to move data across common data busses, which can cause significant power usage and introduce latency into other processes sharing the data bus. Consequently, other aspects of a processing system are being considered for processing machine learning model data.

Memory devices are one example of another aspect of a processing system that may be leveraged for performing processing of machine learning model data through so-called compute in memory (CIM) processes. Unfortunately, CIM processes may not be able to perform processing of complex model architectures, such as depthwise separable convolutional neural networks, without additional hardware elements, such as digital multiply-and-accumulate circuits (DMACs) and related peripherals. These additional hardware elements require additional space, power, and complexity in their implementation, which tend to reduce the advantages of leveraging the memory device as an additional compute resource. Even where ancillary aspects of a processing system have DMACs available to perform processing that cannot be directly performed using CIM processes, moving the data to and from those ancillary aspects requires time and power and therefore mitigate the benefits of the CIM process.

Accordingly, systems and methods are need for performing computation in memory of a wider variety of machine learning model architectures, such as depthwise separable convolutional neural networks.

BRIEF SUMMARY

Certain aspects provide an apparatus, comprising: a compute-in-memory (CIM) array configured to: store a depthwise convolution kernel in a first one or more columns of the CIM array; store a fused convolution kernel in a second one or more columns of the CIM array; store pre-activations in a plurality of rows of the CIM array; process the pre-activations with the depthwise convolution kernel in order to generate depthwise output; generate modified pre-activations based on the depthwise output; and process the modified pre-activations with the fused convolution kernel to generate fused output.

Further aspects provide a method, comprising: storing a depthwise convolution kernel in a first one or more columns of a CIM array; storing a fused convolution kernel in a second one or more columns of the CIM array; storing pre-activations in one or more input data buffers associated with a plurality of rows of the CIM array; processing the pre-activations with the depthwise convolution kernel in order to generate depthwise output; modifying one or more of the pre-activations based on the depthwise output to generate modified pre-activations; and processing the modified pre-activations with the fused convolution kernel to generate fused output.

Other aspects provide processing systems configured to perform the aforementioned methods as well as those described herein; non-transitory, computer-readable media comprising instructions that, when executed by one or more processors of a processing system, cause the processing system to perform the aforementioned methods as well as those described herein; a computer program product embodied on a computer readable storage medium comprising code for performing the aforementioned methods as well as those further described herein; and a processing system comprising means for performing the aforementioned methods as well as those further described herein.

The following description and the related drawings set forth in detail certain illustrative features of one or more aspects.

BRIEF DESCRIPTION OF THE DRAWINGS

The appended figures depict certain aspects of the one or more aspects and are therefore not to be considered limiting of the scope of this disclosure.

To facilitate understanding, identical reference numerals have been used, where possible, to designate identical elements that are common to the drawings. It is contemplated that elements and features of one aspect may be beneficially incorporated in other aspects without further recitation.

DETAILED DESCRIPTION

Figure 1A:
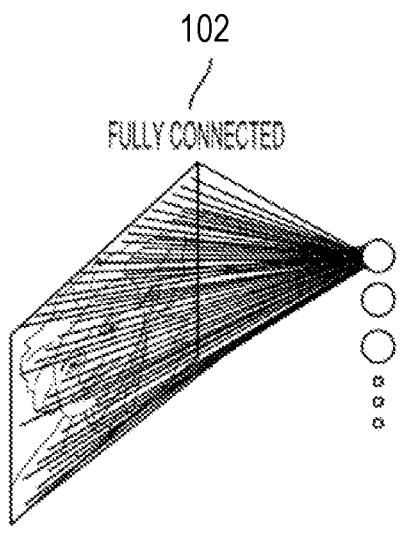
FIGS. 1A-1D depict examples of various types of neural networks.

Aspects of the present disclosure provide apparatuses, methods, processing systems, and computer-readable mediums for performing computation-in-memory (CIM) of machine learning models, including depthwise separable convolutional neural network models.

CIM-based machine learning (ML) and artificial intelligence (AI) task accelerators may be used for a wide variety of tasks, including image and audio processing, user verification, translation, and others. Generally, CIM may be based on various types of memory architecture, including dynamic random access memory (DRAM), static random access memory (SRAM) (e.g., based on an SRAM cell as in FIG. 5A), magnetic random access memory (MRAM), and resistive random access memory (ReRAM), to name a few. Beneficially, CIM may complement other existing processing devices in an electronic device, such as central processing units (CPUs), digital signal processors (DSPs), graphics processing units (GPUs), field programmable gate arrays (FPGAs), and others. Further, CIM may beneficially reduce the "memory wall" problem, which is where the movement of data in and out of memory consumes more power than the computation of the data. Thus, by performing the computation in memory, significant power savings may be realized. This is particularly useful for various types of electronic devices, such as lower power edge processing devices, mobile devices, and the like.

For example, a mobile device may include one or more CIM arrays configured to perform an ML or AI task, such as face or voice recognition, based on data generated by the mobile device, such as image data generated by a camera sensor of the mobile device or audio data generated by a microphone of the mobile device. A memory controller unit (MCU) of the mobile device may be configured to load machine learning model parameters (e.g., weights and biases) from another on-board memory (e.g., flash or RAM) into the one or more CIM arrays of the memory device. The processing device may then commence processing of the image data (in this example) processing data for one or more layers of the machine learning model to generate a model output (e.g., an inference).

CIM arrays are not inherently capable of processing all types of machine learning models without supporting hardware. For example, conventionally, CIM arrays could not process depthwise separable convolution architectures without supporting external hardware, such as a digital multiplication and accumulation (DMAC) block. Having to process model data in external hardware reintroduces the memory wall problem and thus mitigates the advantages of CIM array processing.

To overcome the shortcomings of conventional CIM array processing of depthwise separable convolutional neural network models, aspects described herein utilize fused weight kernels, which eliminate the need to move data outside of the CIM array for processing by a DMAC. Further, aspects described herein may emulate a nonlinear operation with CIM array processing in order to reduce the amount of input pre-activation data that needs to be processed by the CIM using the fused kernel. Accordingly, the methods described herein improve upon processing efficiency and latency as compared to conventional methods.

Brief Background on Neural Networks, Deep Neural Networks, and Deep Learning

Neural networks are organized into layers of interconnected nodes. Generally, a node (or neuron) is where computation happens. For example, a node may combine input data with a set of weights (or coefficients) that either amplifies or dampens the input data. The amplification or dampening of the input signals may thus be considered an assignment of relative significances to various inputs with regard to a task the network is trying to learn. Generally, input-weight products are summed (or accumulated) and then the sum is passed through a node's activation function to determine whether and to what extent that signal should progress further through the network.

In a most basic implementation, a neural network may have an input layer, a hidden layer, and an output layer. "Deep" neural networks generally have more than one hidden layer.

Deep learning is a method of training deep neural networks. Generally, deep learning maps inputs to the network to outputs from the network and is thus sometimes referred to as a "universal approximator" because it can learn to approximate an unknown function $f(x)=y$ between any input x and any output y. In other words, deep learning finds the right $f$ to transform x into y.

More particularly, deep learning trains each layer of nodes based on a distinct set of features, which is the output from the previous layer. Thus, with each successive layer of a deep neural network, features become more complex. Deep learning is thus powerful because it can progressively extract higher level features from input data and perform complex tasks, such as object recognition, by learning to represent inputs at successively higher levels of abstraction in each layer, thereby building up a useful feature representation of the input data.

For example, if presented with visual data, a first layer of a deep neural network may learn to recognize relatively simple features, such as edges, in the input data. In another example, if presented with auditory data, the first layer of a deep neural network may learn to recognize spectral power in specific frequencies in the input data. The second layer of the deep neural network may then learn to recognize combinations of features, such as simple shapes for visual data or combinations of sounds for auditory data, based on the output of the first layer. Higher layers may then learn to recognize complex shapes in visual data or words in auditory data. Still higher layers may learn to recognize common visual objects or spoken phrases. Thus, deep learning architectures may perform especially well when applied to problems that have a natural hierarchical structure.

Layer Connectivity in Neural Networks

Neural networks, such as deep neural networks, may be designed with a variety of connectivity patterns between layers.

FIG. 1A illustrates an example of a fully connected neural network 102. In a fully connected neural network 102, a node in a first layer communicate its output to every node in a second layer, so that each node in the second layer will receive input from every node in the first layer.

Figure 1B:
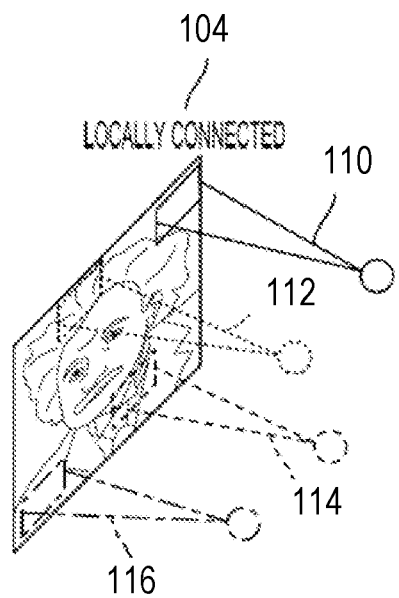

FIG. 1B illustrates an example of a locally connected neural network 104. In a locally connected neural network 104, a node in a first layer may be connected to a limited number of nodes in the second layer. More generally, a locally connected layer of the locally connected neural network 104 may be configured so that each node in a layer will have the same or a similar connectivity pattern, but with connections strengths (or weights) that may have different values (e.g., 110, 112, 114, and 116). The locally connected connectivity pattern may give rise to spatially distinct receptive fields in a higher layer, because the higher layer nodes in a given region may receive inputs that are tuned through training to the properties of a restricted portion of the total input to the network.

Figure 1C:
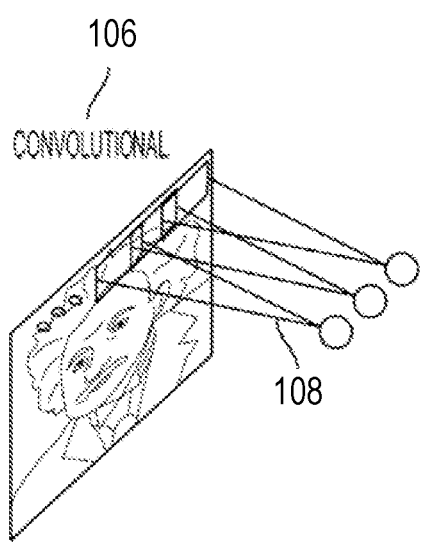

One type of locally connected neural network is a convolutional neural network. FIG. 1C illustrates an example of a convolutional neural network 106. Convolutional neural network 106 may be configured such that the connection strengths associated with the inputs for each node in the second layer are shared (e.g., 108). Convolutional neural networks are well-suited to problems in which the spatial location of inputs is meaningful.

One type of convolutional neural network is a deep convolutional network (DCN). Deep convolutional networks are networks of multiple convolutional layers, which may further be configured with, for example, pooling and normalization layers.

Figure 1D:
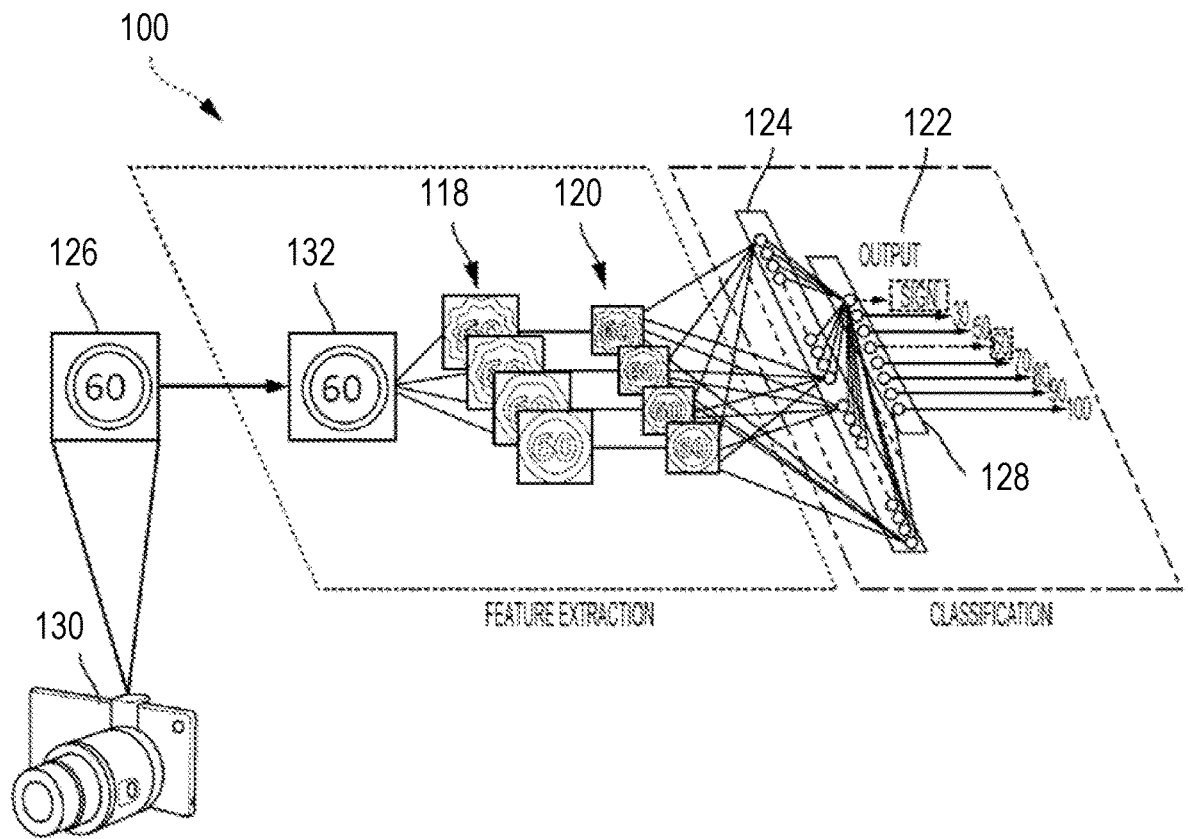

FIG. 1D illustrates an example of a DCN 100 designed to recognize visual features in an image 126 generated by an image capturing device 130. For example, if the image capturing device 130 was a camera mounted in a vehicle, then DCN 100 may be trained with various supervised learning techniques to identify a traffic sign and even a number on the traffic sign. DCN 100 may likewise be trained for other tasks, such as identifying lane markings or identifying traffic lights. These are just some example tasks, and many others are possible.

In this example, DCN 100 includes a feature extraction section and a classification section. Upon receiving the image 126, a convolutional layer 132 applies convolutional kernels (for example, as depicted and described in FIG. 2) to the image 126 to generate a first set of feature maps (or intermediate activations) 118. Generally, "kernels" and "filters" comprise multi-dimensional arrays (e.g., matrices or tensors) of weights designed to emphasize different aspects of an input data channel. Three-dimensional kernels are frequently used in deep learning.

The first set of feature maps 118 may then be subsampled by a pooling layer (e.g., a max pooling layer, not shown) to generate a second set of feature maps 120. The pooling layer may reduce the size of the first set of feature maps 118 while maintain much of the information in order to improve model performance. For example, the second set of feature maps 120 may be down-sampled to 14×14 from 28×28 by the pooling layer.

This process may be repeated through many layers. In other words, the second set of feature maps 120 may be further convolved via one or more subsequent convolutional layers (not shown) to generate one or more subsequent sets of feature maps (not shown).

In the example of FIG. 1D, the second set of feature maps 120 is provided to a fully-connected layer 124, which in turn generates an output feature vector 128. Each feature of the output feature vector 128 may include a number that corresponds to a possible feature of the image 126, such as "sign," "60," and "100." In some cases, a softmax function (not shown) may convert the numbers in the output feature vector 128 to a probability. In such cases, an output 122 of the DCN 100 is a probability of the image 126 including one or more features.

A softmax function (not shown) may convert the numbers in the fourth feature map 128 into a probability in order that an output 122 of DCN 100 is one or more probabilities of the image 126 including one or more features, such as a sign with the numbers "60" on it, as in input image 126. Thus, in the present example, the probabilities in the output 122 for "sign" and "60" should be higher than the probabilities of the others of the output 122, such as "30," "40," "50," "70," "80," "90," and "100".

Before training DCN 100, the output 122 produced by DCN 100 may be incorrect. Thus, an error may be calculated between the output 122 and a target output known a priori. For example, here the target output is an indication that the image 126 includes a "sign" and the number "60". Utilizing the known, target output, the weights of DCN 100 may then be adjusted through training so that subsequent output 122 of DCN 100 achieves the target output.

To adjust the weights of DCN 100, a learning algorithm may compute a gradient vector for the weights. The gradient may indicate an amount that an error would increase or decrease if a weight were adjusted in a particular way. The weights may then be adjusted to reduce the error. This manner of adjusting the weights may be referred to as "back propagation" as it involves a "backward pass" through the layers of DCN 100.

In practice, the error gradient of weights may be calculated over a small number of examples, so that the calculated gradient approximates the true error gradient. This approximation method may be referred to as stochastic gradient descent. Stochastic gradient descent may be repeated until the achievable error rate of the entire system has stopped decreasing or until the error rate has reached a target level.

After training, DCN 100 may be presented with new images and DCN 100 may generate inferences, such as classifications, or probabilities of various features being in the new image.

Convolution Techniques for Convolutional Neural Networks

Convolution is generally used to extract useful features from an input data set. For example, in convolutional neural networks, such as described above, convolution enables the extraction of different features using kernels and/or filters whose weights are automatically learned during training. The extracted features are then combined to make inferences.

An activation function may be applied before and/or after each layer of a convolutional neural network. Activation functions are generally mathematical functions (e.g., equations) that determine the output of a node of a neural network. Thus, the activation function determines whether it a node should pass information or not, based on whether the node's input is relevant to the model's prediction. In one example, where y=Conv(x) (i.e., y=a convolution of x), both x and y may be generally considered as "activations". However, in terms of a particular convolution operation, x may also be referred to as "pre-activations" or "input activations" as it exists before the particular convolution and y may be referred to as output activations or a feature map.

Figure 2:
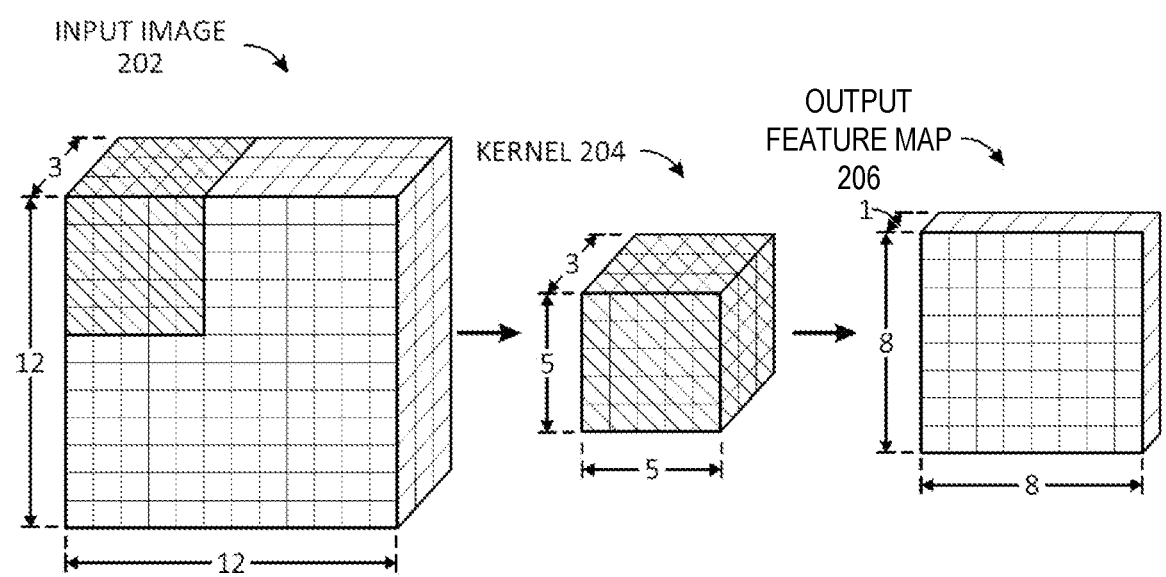
FIG. 2 depicts an example of a conventional convolution operation.

FIG. 2 depicts an example of a traditional convolution in which a 12 pixel×12 pixel×3 channel input image is convolved using a 5×5×3 convolution kernel 204 using a stride of 1. The resulting output feature map 206 is 8 pixels×8 pixels×1 channel. As seen in this example, the traditional convolution may change the dimensionality of the input data as compared to the output data (here, from 12×12 to 8×8 pixels), including the channel dimensionality (here, from 3 to 1 channel).

Figure 3A:
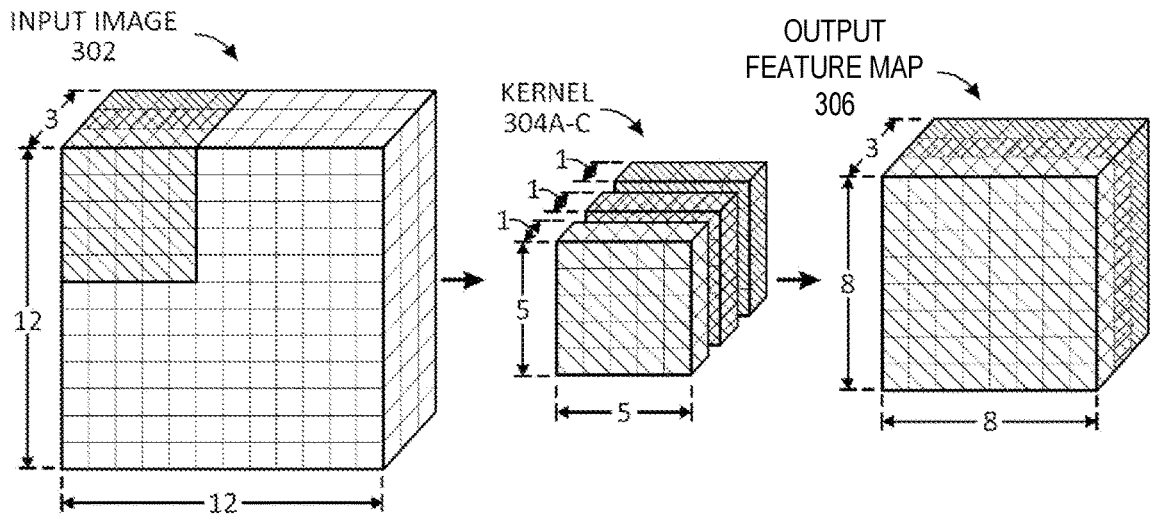
FIGS. 3A and 3B depicts examples of depthwise separable convolution operations.
Figure 3B:
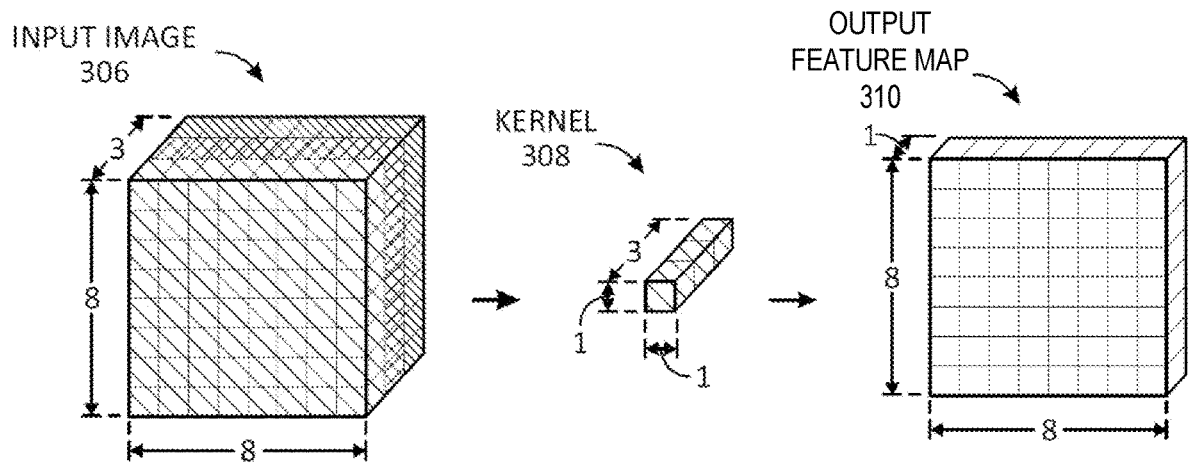

One way to reduce the computational burden (e.g., measured in floating point operations per second (FLOPs)) and the number parameters associated with a neural network comprising convolutional layers is to factorize the convolutional layers. For example, a spatial separable convolution, such as depicted in FIG. 2, may be factorized into two components: (1) a depthwise convolution, wherein each spatial channel is convolved independently by a depthwise convolution (e.g., a spatial fusion); and (2) a pointwise convolution, wherein all the spatial channels are linearly combined (e.g., a channel fusion). An examples of a depthwise separable convolution is depicted in FIGS. 3A and 3B. Generally, during spatial fusion, a network learns features from the spatial planes and during channel fusion the network learns relations between these features across channels.

In one example, a separable depthwise convolutions may be implemented using 3×3 kernels for spatial fusion, and 1×1 kernels for channel fusion. In particular, the channel fusion may use a 1×1×d kernel that iterates through every single point in an input image of depth d, wherein the depth d of the kernel generally matches the number of channels of the input image. Channel fusion via pointwise convolution is useful for dimensionality reduction for efficient computations. Applying 1×1×d kernels and adding an activation layer after the kernel may give a network added depth, which may increase its performance.

FIGS. 3A and 3B depicts an example of a depthwise separable convolution operation.

In particular, in FIG. 3A, the 12 pixel×12 pixel×3 channel input image 302 is convolved with a filter comprising three separate kernels 304A-C, each having a 5×5×1 dimensionality, to generate an output feature map 306 of 8 pixels×8 pixels×3 channels, where each channel is generated by an individual kernel amongst 304A-C.

Then output feature map 306 is further convolved using a pointwise convolution operation in which a filter 308 having dimensionality 1×1×3 to generate an output feature map 310 of 8 pixels×8 pixels×1 channel. As is depicted in this example, output feature map 310 has reduced dimensionality (1 channel versus 3), which allows for more efficient computations with output feature map 310.

Though the result of the depthwise separable convolution in FIGS. 3A and 3B is the same as (or substantially similar to) conventional convolution in FIG. 2, the number of computations is significantly reduced, and thus depthwise separable convolution offers a significant efficiency gain where a network design allows it.

Though not depicted in FIG. 3B, multiple (e.g., m) pointwise convolution kernels 308 (e.g., individual components of a filter) can be used to increase the channel dimensionality of the convolution output. So, for example, m=256 1×1>3 kernels 308 can be generated, which each output an 8 pixels×8 pixels×1 channel output image (e.g., 310), and these output images can be stacked to get a resulting output image of 8 pixels×8 pixels×256 channels. The resulting increase in channel dimensionality provides more parameters for training, which may improve a convolutional neural network's ability to identify features (e.g., in input image 302).

Example Compute in Memory (CIM) Architecture

Figure 4:
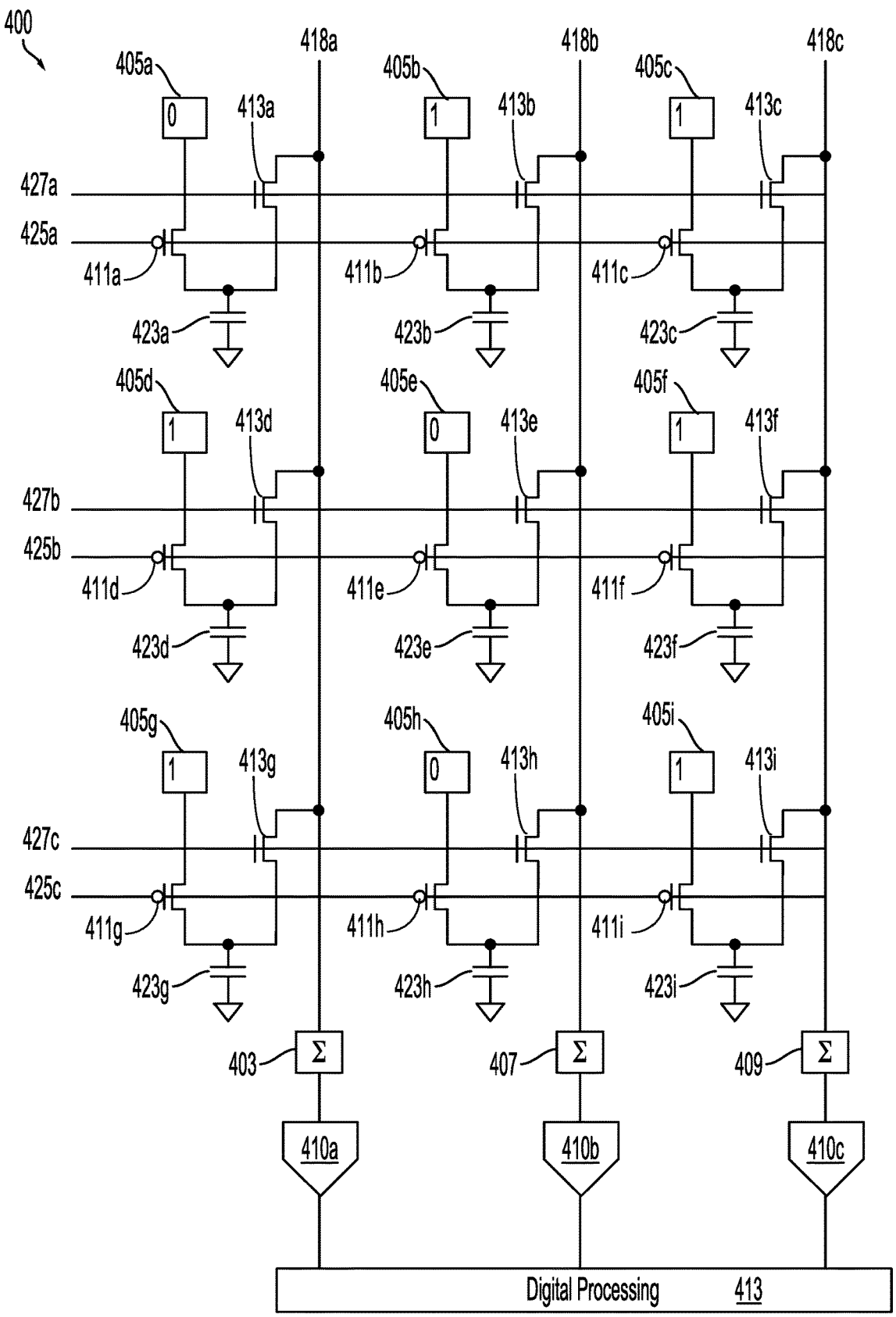
FIG. 4 illustrates an example compute-in-memory (CIM) array configured for performing machine learning model computations.

FIG. 4 illustrates an exemplary compute-in-memory (CIM) array 400 configured for performing machine learning model computations, according to aspects of the present disclosure. In this example, CIM array 400 is configured to simulate MAC operations using mixed analog/digital operations for an artificial neural network. Accordingly, as used herein, the terms multiplication and addition may refer to such simulated operations. CIM array 400 can be used to implement aspects of the processing techniques described herein.

In the depicted aspect, CIM array 400 includes pre-charge word lines (PCWLs) 425a, 425b and 425c (collectively 425), read word lines (RWLs) 427a, 427b, and 427c (collectively 427), analog-to-digital converters (ADCs) 410a, 410b and 410c (collectively 410), a digital processing unit 413, bitlines 418a, 418b, and 418c (collectively 418), PMOS transitors 411a-411i (collectively 411), NMOS transitors 413a-413i (collectively 413), and capacitors 423a-423i (collectively 423).

Weights associated with a neural network layer may be stored in SRAM cells of CIM array 400. In this example, binary weights are shown in the SRAM bitcells 405a-405i of CIM array 400. Input activations (e.g., input values that may be an input vector) are provided on the PCWLs 425a-c.

Multiplication occurs in each bitcell 405a-405i of CIM array 400 associated with a bitline and the accumulation (summation) of all the bitcell multiplication results occurs on the same bitline for one column. The multiplication in each bitcell 405a-405i is in the form of an operation equivalent to an AND operation of the corresponding activation and weight, where the result is stored as a charge on the corresponding capacitor 423. For example, a product of 1, and consequently a charge on the capacitor 423, is produced only where the activation is one (here, because a PMOS is used, the PCWL is zero for an activation of one) and the weight is one.

For example, in an accumulating stage, RWLs 427 are switched to high so that any charges on capacitors 423 (which is based on corresponding bitcell (weight) and PCWL (activation) values) can be accumulated on corresponding bitlines 418. The voltage values of the accumulated charges are then converted by ADCs 410 to digital values (where, for example, the output values may be a binary value indicating whether the total charge is greater than a reference voltage). These digital values (outputs) may be provided as input to another aspect of a machine learning model, such as a following layer.

When activations on pre-charge word lines (PCWLs) 425a, 425b and 425c are, for example, 1, 0, 1, then the sums of bitlines 418a-c correspond to 0+0+1=1, 1+0+0=1, and 1+0+1=2, respectively. The output of the ADCs 410a, 410b and 410c are passed on to the digital processing unit 413 for further processing. For example, if CIM 400 is processing multi-bit weight values, the digital outputs of ADCs 410 may be summed to generate a final output The exemplary 3×3 CIM circuit 400 may be used, for example, for performing efficient 3-channel convolution for three-element kernels (or filters), where the weights of each kernel correspond to the elements of each of the three columns, so that for a given three-element receptive field (or input data patch), the outputs for each of the three channels are calculated in parallel.

Notably, while FIG. 4 describes an example of CIM using SRAM cells, other memory types can be used. For example, dynamic random access memory (DRAM), magnetoresistive random-access memory (MRAM), and resistive random-access memory (ReRAM or RRAM) can likewise be used in other embodiments.

Figure 5A:
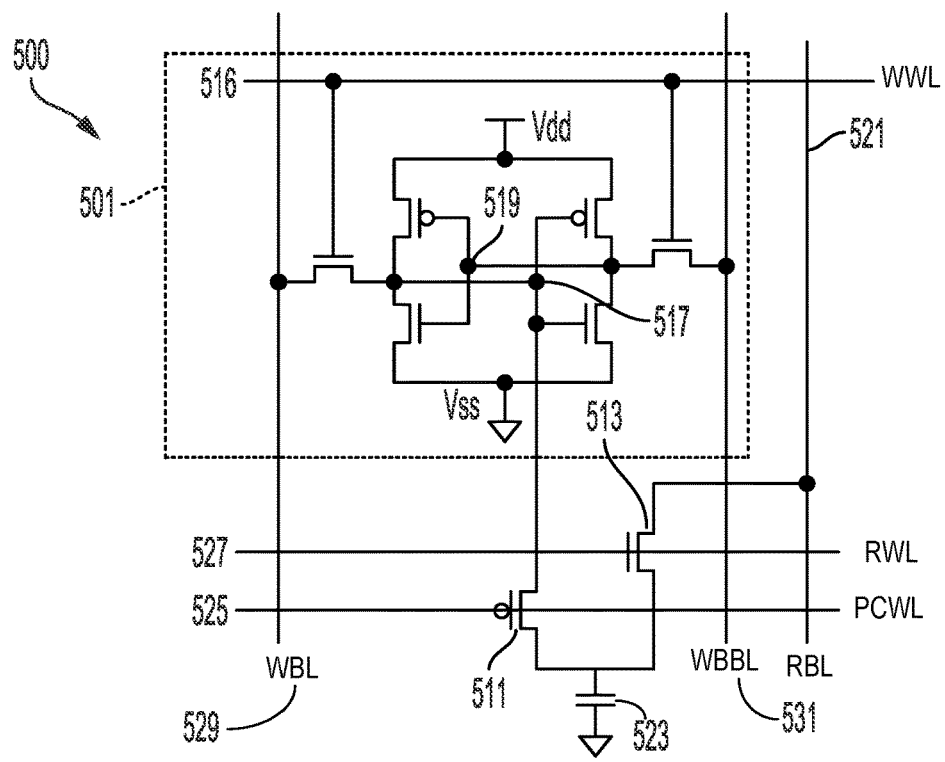
FIGS. 5A and 5B depict example bitcells, which may be representative of the bitcells in FIG. 4, and which may generally be used for CIM operations as described herein.

FIG. 5A depicts additional details of an exemplary bitcell 500.

Aspects of FIG. 5A may be exemplary of or otherwise relate to aspect of FIG. 4. In particular, bitline 521 is similar to the bitline 418a, capacitor 523 is similar to the capacitor 423 of FIG. 4, read word line 527 is similar to the read word line 427a of FIG. 4, pre-charge word line 525 is similar to the pre-charge word line 425a of FIG. 4, PMOS transistor 511 is similar to PMOS transistor 411a of FIG. 4, and NMOS transistor 513 is similar to NMOS transistor 413 of FIG. 4.

The bitcell 500 includes a static random access memory (SRAM) cell 501 which may be representative of SRAM bitcells 405a of FIG. 4, as well as transistors 511 (e.g., a PMOS transistor), transistor 513 (e.g., an NMOS transistor), and capacitor 523 coupled to ground. Although a PMOS transistor is used for the transistor 511, other transistors (e.g., an NMOS transistor) can be used in place of the PMOS transistor, with corresponding adjustment (e.g., inversion) of their respective control signals. The same applies to the other transistors described herein. The additional transistors 511 and 513 are included to implement the compute-in-memory array, according to aspects of the present disclosure. In one aspect, the SRAM cell 501 is a conventional six transistor (6T) SRAM cell.

Programming of weights in the bitcell may be performed once for a multitude of activations. For example, in operation, the SRAM cell 501 receives only one bit of information at nodes 517 and 519 via a write word line (WWL) 516. For example, during write (when WWL 516 is high), if write bit line (WBL) 529 is high (e.g., "1"), then node 517 sets to high and node 519 sets to low (e.g., "0"); or if WBL 529 is low, then node 517 sets to low and node 519 sets to high. Conversely, during write (when WWL 516 is high), if write bit bar line (WBBL) 531 is high, then node 517 sets to low and node 519 sets to high; or if WBBL 529 is low, then node 517 sets to high and node 519 sets to low.

The programming of weights may be followed by an an activation input and multiplication step to charge the capacitors in accordance with the corresponding products. For example, the transistor 511 is activated by an activation signal through a pre-charge word line (PCWL) 525 of the compute-in-memory array to perform the multiplication step. Then, the transistor 513 is activated by a through another word line (e.g., a read word line (RWL) 527) of the compute-in-memory array to perform the accumulation of the multiplication value from bitcell 500 with other bitcells of an array, such as described above with respect to FIG. 4.

If node 517 is a "0," (e.g., when the the stored weight value is "0") the capacitor 523 will not be charged if a low PCWL indicates an activation of "1" at the gate of the transistor 511. Accordingly, no charge is provided to a bitline 521. However, if node 517, which corresponds to the weight value, is a "1", and PCWL is set to low (e.g., when the activation input is high), which turns on PMOS transistor 511, which acts as a short, allowing capacitor 523 to be charged. After the capacitor 523 is charged, the transistor 511 is turned off so the charge is stored in the capacitor 523. To move the charge from the capacitor 523 to the bitline 521, the NMOS transistor 513 is turned on by RWL 527 causing the the NMOS transistor 513 to act as a short.

Table 1 illustrates an example of compute-in-memory array operations according to an AND operational setting, such as may be implemented by bitcell 500 in FIG. 5A.

TABLE 1

| AND Operation | | | |
|---|---|---|---|
| Activation | PCWL | Cell Node (Weight) | Capacitor Node |
| 1 | 0 | 1 | 1 |
| 1 | 0 | 0 | 0 |

TABLE 1-continued

| AND Operation | | | |
|---|---|---|---|
| Activation | PCWL | Cell Node (Weight) | Capacitor Node |
| 0 | 1 | 1 | 0 |
| 0 | 1 | 0 | 0 |

A first column (Activation) of Table 1 includes possible values of an incoming activation signal.

A second column (PCWL) of Table 1 includes PCWL values that activate transistors designed to implement compute-in-memory functions according to aspects of the present disclosure. Because the transistor 511 in this example is a PMOS transistor, the PCWL values are inverses of the activation values. For example, the compute-in-memory array includes the transistor 511 that is activated by an activation signal (PCWL signal) through the pre-charge word line (PCWL) 525.

A third column (Cell Node) of Table 1 includes weight values stored in the SRAM cell node, for example, corresponding to weights in a weight tensor, such as a may be used in convolution operations.

A fourth column (Capacitor Node) of Table 1 shows the resultant products that will be stored as charge on a capacitor. For example, the charge may be stored at a node of the capacitor 523 or a node of one of the capacitors 423a-423i. The charge from the capacitor 523 is moved to the bitline 521 when the transistor 513 is activated. For example, referring to the transistor 511, when the weight at the cell node 517 is a "1" (e.g., high voltage) and the input activation is a "1" (so PCWL is "0"), the capacitor 523 is charged (e.g., the node of the capacitor is a "1"). For all other combinations, the capacitor node will have a value of 0.

Figure 5B:
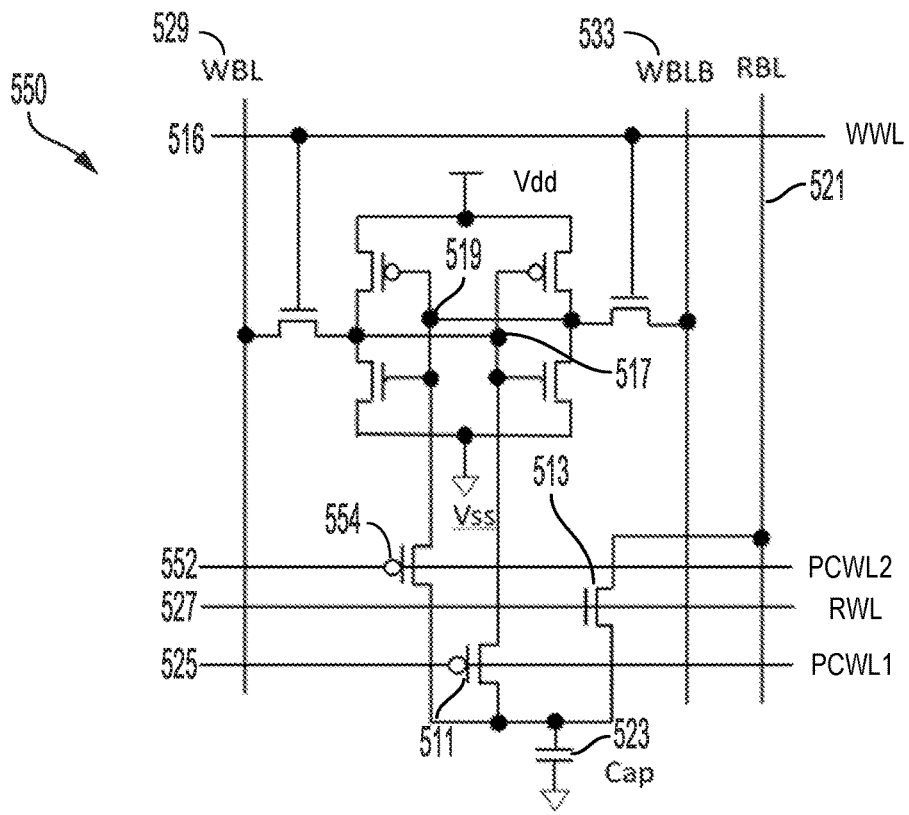

FIG. 5B depicts additional details of another exemplary bitcell 550, which may likewise be representative of any of bitcells 405a-i in FIG. 4.

Bitcell 550 differs from bitcell 500 in FIG. 5A primarily based on the inclusion of an additional pre-charge word line 552 coupled to an additional transistor 554. Pre-charge word line 552 allows for bitcell 550 to be placed in an AND operating mode or an XNOR operating mode based on its state. For example, when pre-charge word line 552 is tied high, bitcell 550 operates in an AND mode, and otherwise it acts in an XNOR mode.

Table 2 illustrates an example of compute-in-memory array operations similar to Table 1, except according to an XNOR operational setting, such as may be implemented by bitcell 550 in FIG. 5B.

TABLE 2

| XNOR Operation | | | | |
|---|---|---|---|---|
| Activation | PCWL1 | PCWL2 | Cell Node (Weight) | Capacitor Node |
| 1 | 0 | 1 | 1 | 1 |
| 1 | 0 | 1 | 0 | 0 |
| 0 | 1 | 0 | 1 | 0 |
| 0 | 1 | 0 | 0 | 1 |

A first column (Activation) of Table 2 includes possible values of an incoming activation signal.

A second column (PCWL1) of Table 2 includes PCWL1 values that activate transistors designed to implement compute-in-memory functions according to aspects of the present disclosure. Here again, the transistor 511 is a PMOS transistor, the PCWL1 values are inverses of the activation values.

A third column (PCWL2) of Table 2 includes PCWL2 values that activate further transistors designed to implement compute-in-memory functions according to aspects of the present disclosure.

A fourth column (Cell Node) of Table 2 includes weight values stored in the SRAM cell node, for example, corresponding to weights in a weight tensor, such as may be used in convolution operations.

A fifth column (Capacitor Node) of Table 2 shows the resultant products that will be stored as charge on a capacitor, such as capacitor 523.

Figure 6:
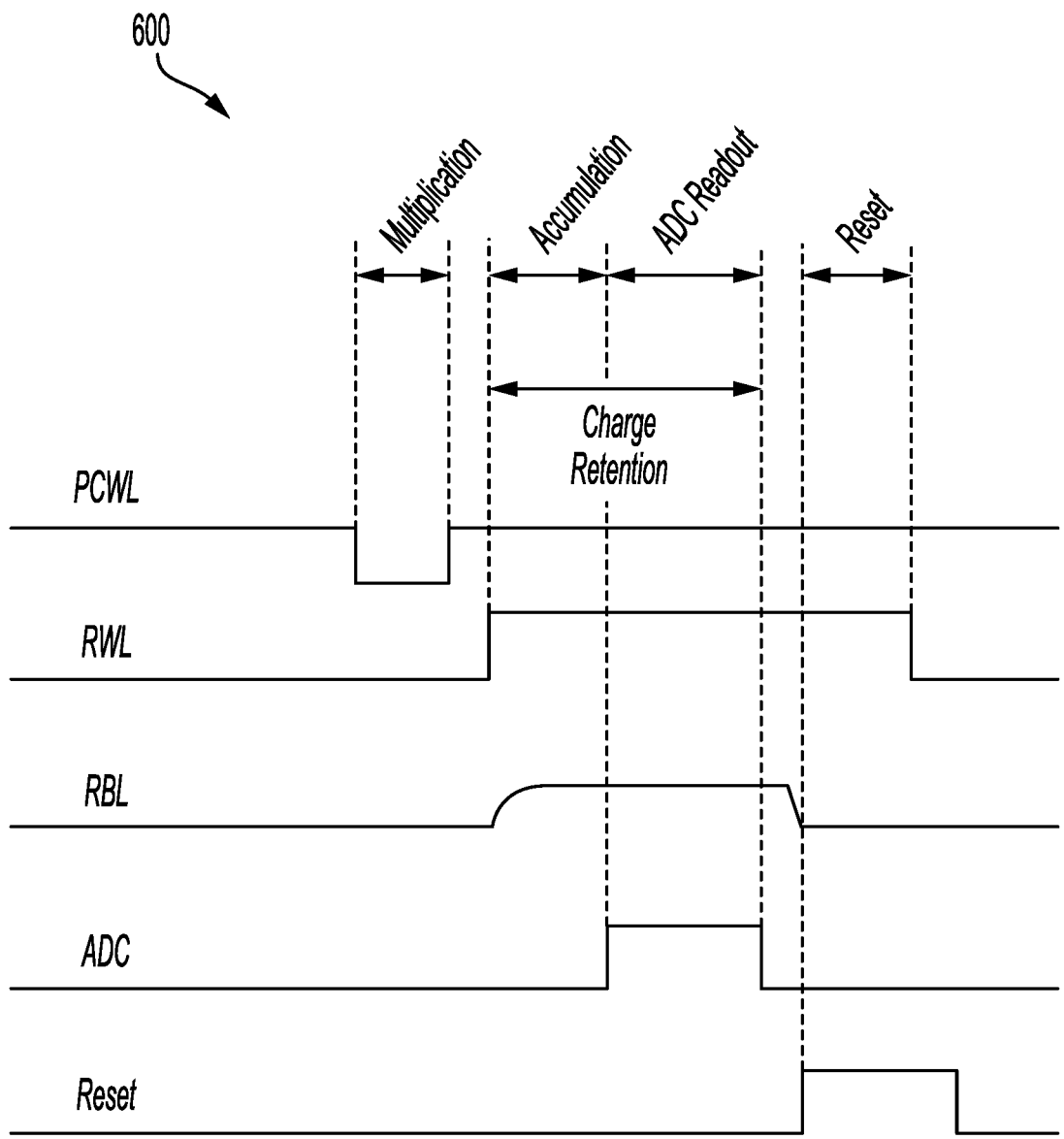
FIG. 6 depicts an example timing diagram of various signals during a compute-in-memory (CIM) array operation.

FIG. 6 depicts an example timing diagram 600 of various signals during a compute-in-memory (CIM) array operation.

In the depicted example, a first row of the timing diagram 600 shows a pre-charge word line PCWL (e.g., 425a of FIG. 4 or 525 of FIG. 5A), going low. In this example, a lowPCWL indicates an activation of "1." The PMOS transistor turns on when PCWL is low, which allows charging of the capacitor (if the weight is "1"). A second row shows a read word line RWL (e.g., read word line 427a of FIG. 4 or 527 of FIG. 5A.) A third row shows a read bitline RBL (e.g. 418 of FIG. 4 or 521 of FIG. 5A), a fourth row shows an analog-to-digital converter (ADC) readout signal and a fifth row shows a reset signal.

For example, referring to the transistor 511 of FIG. 5A, a charge from the capacitor 523 is gradually passed on to the read bitline RBL when the read word line RWL is high.

A summed charge/current/voltage (e.g., 403 of FIG. 4 or charges summed from the the bitline 521 of FIG. 5A) is passed on to a comparator or ADC (e.g., the ADC 410a of FIG. 4) where the summed charge is converted to a digital output (e.g., digital signal/number). The summing of the charge may occur in an accumulation region of the timing diagram 600 and a readout from the ADC may be associated with the ADC readout region of the timing diagram 600. After the ADC readout is obtained, the reset signal discharges all of the capacitors (e.g., capacitors 423a-423i) in preparation for processing the next set of activation inputs.

Example of Convolution Processing in Memory

Figure 7:
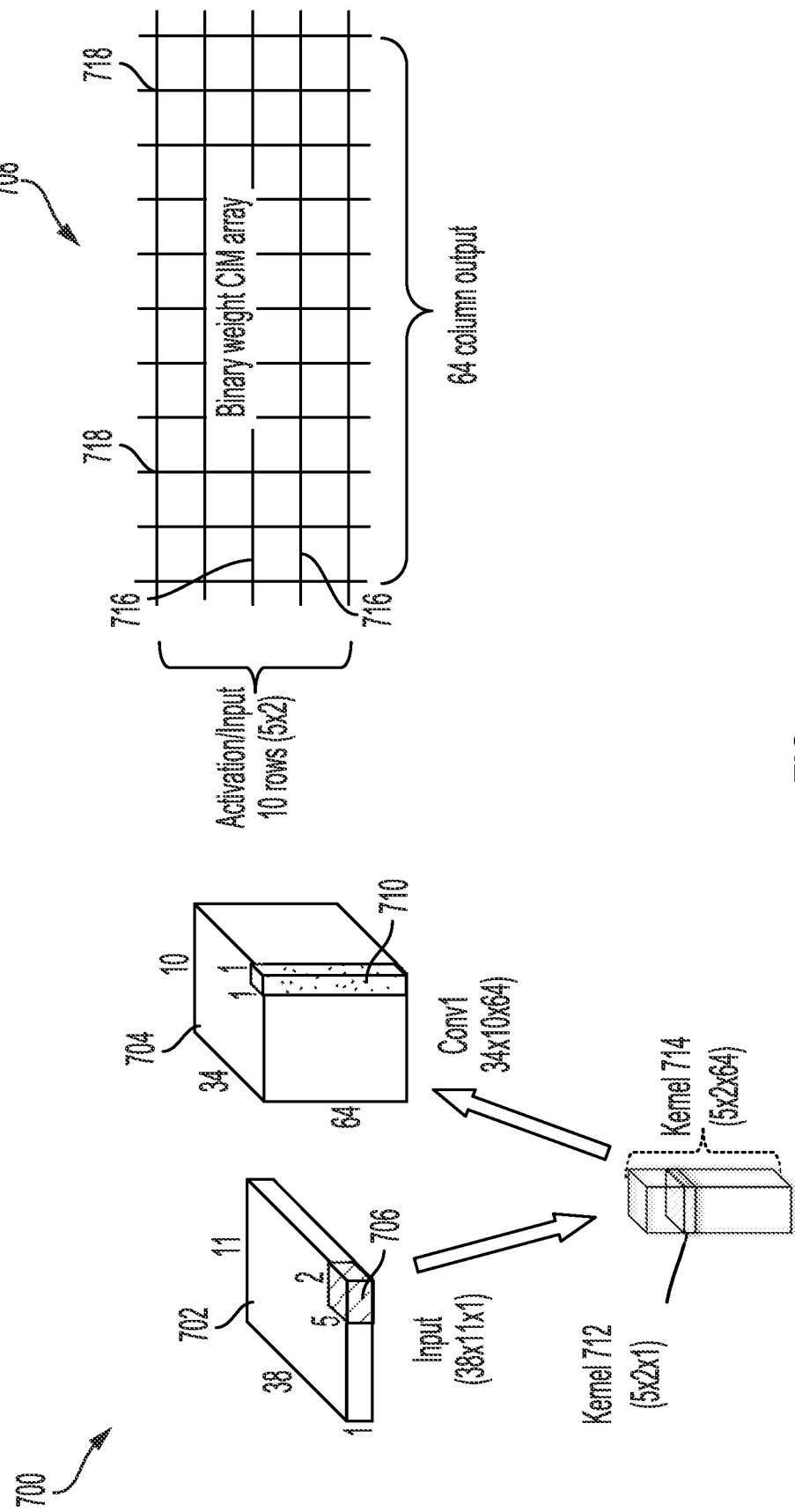
FIG. 7 depicts an exemplary convolutional layer architecture implemented by a compute-in-memory (CIM) array.

FIG. 7 depicts an exemplary convolutional layer architecture 700 implemented by a compute-in-memory (CIM) array 708. The convolutional layer architecture 700 may be a part of a convolutional neural network (e.g., as described above with respect to FIG. 1D) and designed to process multidemensional data, such as tensor data.

In the depicted example, input 702 to the convolutional layer architecture 700 has dimensions of 38 (height)×11 (width)×1 (depth). The output 704 of the convolutional layer has dimensions 34×10×64, which includes 64 output channels corresponding to the 64 kernels of kernel tensor 714 applied as part of the convolution process. Further in this example, each kernel (e.g., exemplary kernel 712) of the 64 kernels of kernel tensor 714 has dimensions of 5×2×1 (all together, the kernels of filter tensor 714 are equivalent to one 5×2×64 kernel).

During the convolution process, each 5×2×1 kernel is convolved with the input 702 to generate one 34×10×1 layer of output 704. During the convolution, the 640 weights of kernel tensor 714 (5×2×64) may be stored in the compute-in-memory (CIM) array 708, which in this example includes a column for each kernel (i.e., 64 columns). Then activations of each of the 5×2 receptive fields (e.g., receptive field input 706) are input to the CIM array 708 using the word lines, e.g., 716, and multiplied by the corresponding weights to produce a 1×1×64 output tensor (e.g., an output tensor 710). Output tensors 704 represent an accumulation of the 1×1×64 individual output tensors for all of the receptive fields (e.g., the receptive field input 706) of the input 702. For simplicity, the compute-in-memory array 708 of FIG. 7 only shows a few illustrative lines for the input and the output of the compute-in-memory array 708.

In the depicted example, CIM array 708 includes wordlines 716 through which the CIM array 708 receives the receptive fields (e.g., receptive field input 706), as well as bitlines 718 (corresponding to the columns of the CIM array 708). Though not depicted, CIM array 708 may also include pre-charge wordlines (PCWL) and read word lines RWL (as described above with respect to FIGS. 4 and 5).

In this example, wordlines 716 are used for initial weight definition. However, once the initial weight definition occurs, the activation input activates a specially designed line in a CIM bitcell to perform a MAC operation. Thus, each intersection of a bitline 718 and a wordline 716 represents a kernel weight value, which is multiplied by the input activation on the wordline 716 to generate a product. The individual products along each bitline 718 are then summed to generate corresponding output values of the output tensor 710. The summed value may be charge, current, or voltage. In this example, the dimensions of the output tensor 704, after processing the entire input 702 of the convolutional layer, are 34×10×64, though only 64 kernel outputs are generated at a time by the CIM array 708. Thus, the processing of the entire input 702 may be completed in 34×10 or 340 cycles.

CIM Architectures for Depthwise Separable Convolution

Vector-matrix multiplication blocks implemented in memory for CIM architectures can perform conventional convolutional neural network processing generally well, but they are not efficient for supporting depthwise separable convolutional neural networks, which are found in many state of the art machine learning architectures. For example, existing CIM architectures generally cannot perform depthwise separable convolutional neural networks processing in one phase because each multidimensional kernel needs different input channels. Thus, the kernel weights in the same row cannot share the same activation input for different channels. Consequently, matrix-matrix multiplication (M×M) architectures are generally needed to support depthwise separable convolution processing in a one phase cycle.

Conventional solutions for addressing this shortcoming include adding a separate digital multiplication and accumulation (DMAC) block to handle processing for the depthwise portion of a separable convolution while a CIM array can handle the pointwise portion of the separable convolution. However, this hybrid approach results in increased data movement, which can offset the memory efficient advantage of the CIM architecture. Further, the hybrid approach generally requires additional hardware (e.g., the DMAC element, DMA, buffer, and others), which increases space and power needs, and increased processing latency. Moreover, the use of DMACs may impact timing of processing operations and cause model output timing constraints (or other dependencies) to be overrun. In order to resolve that issue, various compromises may be necessary, such as reducing the frame rate of incoming data, increasing the clock rate of processing system elements (including a CIM array), reducing input feature size, and others.

Accordingly, described herein are CIM architectures that support both conventional convolutional neural networks (CNNs) and depthwise separable CNNs (DW-CNNs) with minimal additional hardware. In particular, the CIM architectures described herein fuse the weights for the conventionally separate phases of depthwise and pointwise convolutions so that they may be performed effectively simultaneously using a CIM array without the need for additional hardware, like a DMAC.

The CIM architectures described herein improve the power consumption and timing performance of processing operations for depthwise separable convolutions. These improvements beneficially result in less cycle time for depthwise separable convolution operations and achieve higher total operations per second (TOPS) per watt of processing power, i.e., TOPS/W, compared to conventional architectures that require more hardware (e.g., DMACs) and/or more data movement.

Further, the CIM architectures described herein may also implement input range compression to improve CIM analog to digital conversion accuracy.

DMAC-Free Depthwise Separable Convolution Processing with Fused Weights

Fusing weights for the two conventional phases of a depthwise separable convolution (i.e., the depthwise phase and the pointwise phase) beneficially allows for processing an equivalent, or near equivalent (for example, bitwise, quantization may cause slight variances in convolution output), depthwise separable convolution without need for a DMAC. Further, fusing the weights allows both phases of a depthwise separable convolution (e.g., the depthwise and pointwise phases) to be processed without the need to generate and store the depthwise output explicitly, thus avoiding any data movement, reducing power use, and reducing processing time and latency.

Figure 8:
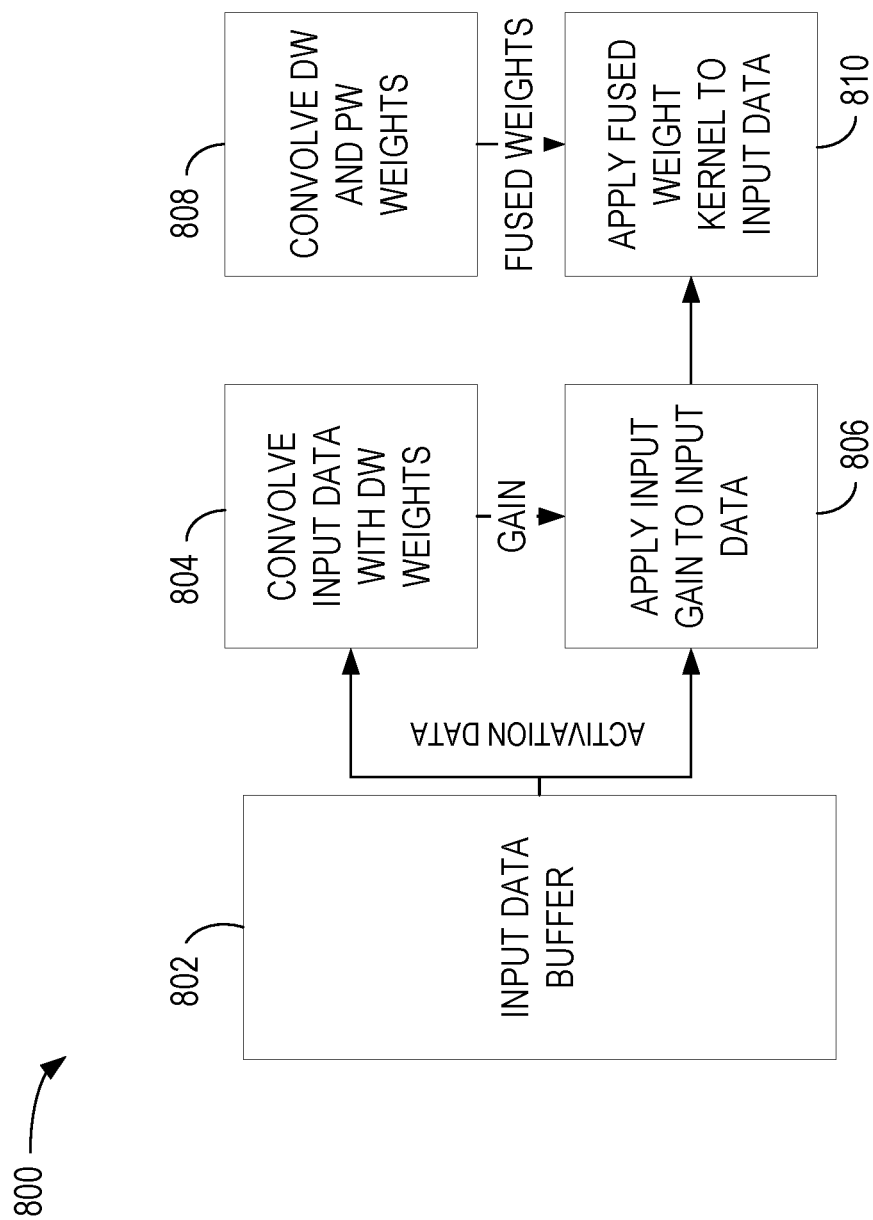
FIG. 8 depicts an example process for applying fused weights to a depthwise separable convolution operation

FIG. 8 depicts an example process 800 for applying fused weights to a depthwise separable convolution operation (such as described generally with respect to FIGS. 3A and 3B, above).

Generally, fusing the weights of a depthwise convolution layer and the weights of a pointwise convolution layer may be performed offline (e.g., at step 808) by convolving the weights of each layer, where the weights for each layer have the same channel dimensionality. By way of example, with reference to FIGS. 3A-3B, the depthwise kernel size is 5×5×3, the pointwise kernel size is 1×1×3×N, where N is the number of 1×1 kernels. The resulting fused weights size is 5×5×3×N.

The fused weights may need to be requantized to a preferred bit width prior to being used in a CIM array to process input data. Thus, fused weights ($W^{fused}$) may be obtained by the following expression:

$$W^{fused} = \text{requantize}(\text{convolve}(W^{depthwise}, W^{pointwise})).$$

Though not depicted in FIG. 8, requantizing the fused weights, $W^{fused}$, may be performed prior to applying the fused weights in step 810, such as by a fusion processing block that is part of or otherwise in data communication with a host processing system in which the CIM array is implemented.

Using fused weights may require two operations per patch of input data.

First, a depthwise convolution may be run in a CIM array (e.g., at step 804) on input data 802 to determine a gain for input data to be processed by the CIM array with fused weights in step 810. For example, the gain may be used to set zero and negative output values from the convolution at step 804 to zero prior to being processed with the fused weights at step 810. Thus, the gain may act as an equivalent to applying a nonlinear operation, such as a ReLU operation, after the convolution operation at step 804, without actually needing to run the output through a nonlinear operation block.

In some scenarios, when the threshold comparison indicates that the gain can be set to zero, an input row in the CIM array may instead be deactivated (e.g., tristated), which saves power during processing. For example, when the output of depthwise operation at 804 is below the threshold, then the row(s) associated with the input that generated the output may be tristated if a ReLU nonlinear operation follows the depthwise layer in the model architecture. For nonlinear functions other than ReLU following the depthwise layer in the model architecture, a gain may generally be set based on the shape of the non-linear function. The gain may be read in from registers, retrieved from a look-up table, or the like. So, for example, where a depthwise separable convolution architecture implements a different nonlinear operation, such as Leaky ReLU, then a non-zero gain may be set.

Second, the determined gain may be applied to the input data at step 806, which may zero out some of the input data elements and thereby form modified input data, and then fused weights may be applied to the modified input data at step 810 in a CIM array. As above, the fused weights may be generated offline by convolving the depthwise and pointwise weights at step 808.

Figure 9:
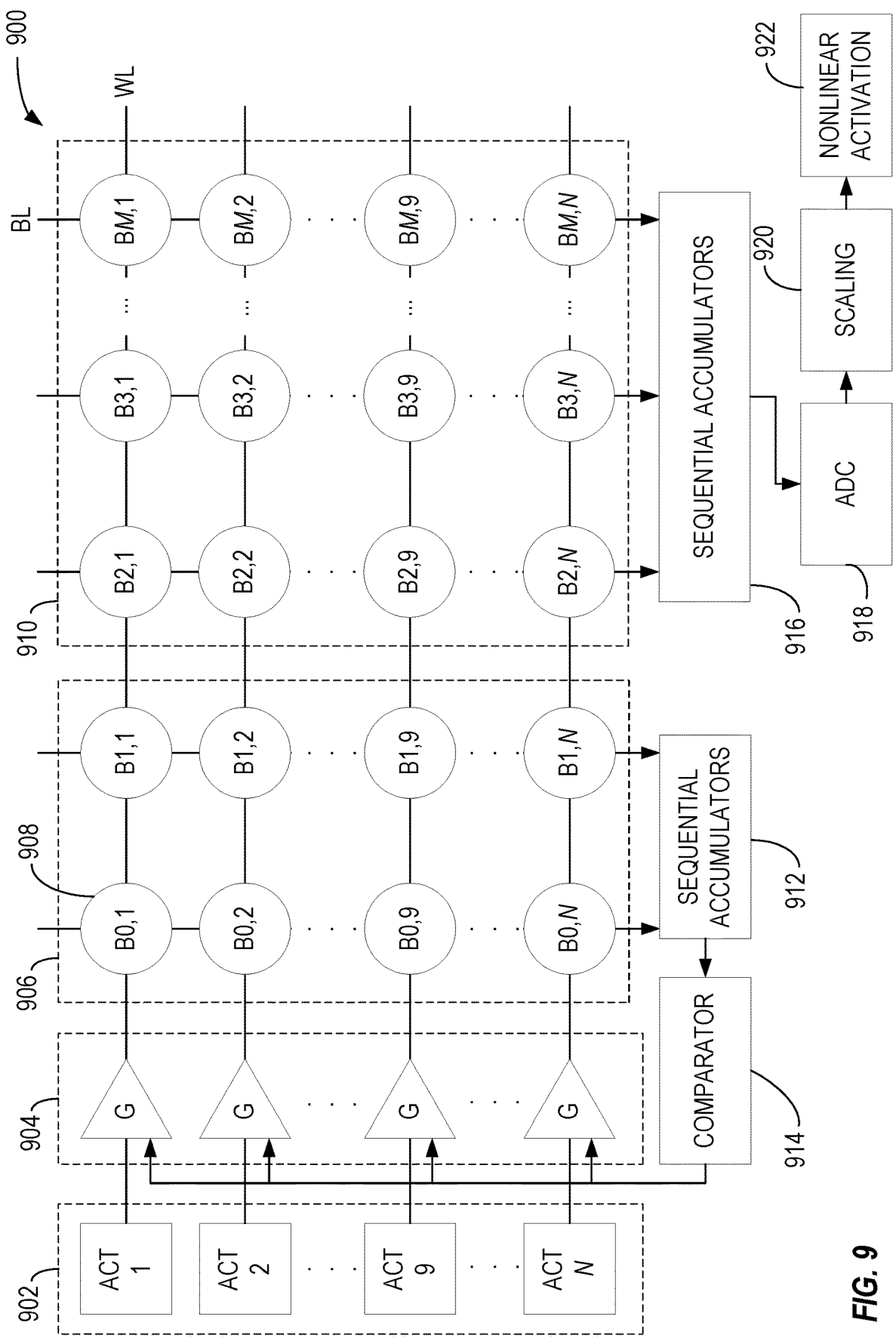
FIG. 9 depicts an example CIM architecture configured to use fused weights to perform depthwise separable convolution without a DMAC.

Example CIM Architecture for Performing Depthwise Separable Convolution without a DMAC FIG. 9 depicts an example CIM architecture 900 configured to use fused weights to perform depthwise separable convolution without the need for a DMAC.

In the example of FIG. 9, there are N bits of input pre-activation data stored, for example, in input data buffers 902, corresponding to the number of input bits for a patch (or receptive field) of input data. For example, for a 3×3 patch of binary input data (i.e., 1 bit), N=9. The pre-activation data may be received from an input data buffer, such as 802 in FIG. 8. For multibit pre-activation data, the input data may be sequentially processed in 1-bit patches. For example, each individual input data buffer (e.g., associated with one row of the CIM, may have pre-activation input buffer registers that hold 8 bits of input data for each CIM input line. The input data buffer can retrieve or receive data from system memory.

Multi-bit depthwise kernel weights are stored in a plurality of bitcells 906 of a CIM array, wherein each individual bitcell (e.g., 908) is addressable by a wordline (WL) and a bitline (BL) for performing CIM processing. In this example, the depthwise kernel weights are two-bit and thus are written to two bitlines (e.g., B0 and B1 in this example). For simplicity, only N wordlines (rows) of the CIM array are depicted in FIG. 9, but the CIM array may comprise additional wordlines, bitlines, bitcells, and the like. Similarly, the input activation size and kernel sizes may be different in other examples.

Sequential accumulators 912 are connected to the outputs of bitcells 906 and configured to perform sequential accumulation (e.g., voltage accumulation) on the output of each of the bitcells 906 during CIM processing. In some aspects, there is one sequential accumulator connected to each bitline, and the sequential accumulators can be connected together in order to accumulate across multiple bitlines (e.g., voltage across multiple bitlines). In some aspects, every set number of serially connected accumulators is connected to an output to another processing block. For example, in an 8-bit example, every eighth serial accumulator may be connected to an output, such as comparator 914 or ADC 918 in the example of FIG. 9. Note that this set number may vary in different aspects. In some aspects, comparator 914 can be considered as a simplified ADC with a coarse grain output.

In this example, the output of sequential accumulators 912 is provided to comparator 914, which is configured to compare the output to a threshold, such as a voltage threshold. In one aspect, comparator 914 comprises an array of M comparators, where M is the number of depthwise channels, and each comparator output controls a group of 9 input gain blocks (e.g., for a 3×3 depthwise kernel size case) at a time.

Based on the comparison by comparator 914, a gain is determined and set by gain blocks 904. In one example, when the output of sequential accumulators 912 is below a threshold, as determined by comparator 914, the gain blocks 904 are set to zero for activations 1 . . . N when processed by the fused weights in bitcells 910.

The processing of bitcells 906 by the CIM array and the subsequent gain setting through sequential accumulators 912, comparator 914, and gain blocks 904 corresponds to the first operation described above with respect to FIG. 8.

Fused weights are stored in a plurality of bitcells 910 of the CIM array. In this example, the fused weights stored in bitcell 910 are likewise two-bit, and thus are written to two bitlines (e.g., B2 and B3 in this example). More generally, a fused weight kernel with stride=1 may generally have a dimensionality of $W_{DW} \times H_{DW} \times C_{DW} \times C_{PW}$, where $W_{DW}$ is the width of the depthwise kernel, $H_{DW}$ is the height of the depthwise kernel, $C_{DW}$ is number of the channels in the depthwise kernel, and $C_{PW}$ is the number of channels in the pointwise kernel. Thus, the CIM dimensionality of the fused weight kernel may be ($W_{DW} \times H_{PW} \times C_{DW}$) rows (wordlines) by ($BW_{DW}+(BW_{Fused} \times C_{DW})$) columns (bitlines).

As described above with respect to FIG. 8, fused weights may be generated offline by convolving depthwise convolution layer weights with pointwise convolution layer weights. In some examples, the resulting fused weights may be scaled to match the bit width of the CIM array in which they will be processed. Note that it is possible for the depthwise and pointwise weights to have different bit widths. If the fused weights have a bit width that is larger than the bit width of the CIM array, then the fused weights can be scaled using a scaling factor and the final output can be scaled back after the analog to digital conversion.

Sequential accumulators 916 are connected to the outputs of bitcells 910 and configured to perform sequential accumulation (e.g., voltage accumulation) on the output of each of the bitcells 910 during CIM processing. Note that in this example a separate set of sequential accumulators 916 is depicted, but this may be the same sequential accumulators as 912 multiplexed between various sets of columns in some aspects.

Analog-to-digital converter (ADC) 918 is connected to sequential accumulators 916 and configured to convert the analog domain output to digital domain output. As above, ADC 918 may be connected to one sequential accumulator at the end of a string of a set number of sequential accumulators. That is, ADC 918 need not have a direct connection to each and every sequential accumulator.

In some aspects, such as for an 8-bit weight case, each group of 8 columns in a CIM array may be connected to one ADC (e.g., an 8-bit ADC), such as ADC 918. In other aspects, for example for certain low power implementation, an ADC may be time shared by multiple 8 column groups to save area and power. In other aspects, the number of columns connected to each ADC may be based on the bit-width of the weights.

Scaling block 920 is connected to the output of ADC 918 and configured to optionally scale the output prior to performing a nonlinear activation operation on the output. For example, if the bit width of the activation was scaled for the size of the CIM array, it can be rescaled to an original bit width prior to downstream digital domain processing, such as in nonlinear activation block 922.

Accordingly, FIG. 9 depicts an example of a single CIM array performing depthwise separable convolutional neural network processing with fused weights without the need for a DMAC block.

Note that FIG. 9 only depicts a subset of bitcells of a CIM array for simplicity and clarity. For example, pre-activation data stored in input buffers 902 may represent a single channel-wise group of data for processing, as described further below with respect to FIG. 10. However, the CIM array may have many additional wordlines (rows) and bitlines (columns) such that additional data may be loaded and processed concurrently, such as multiple channel-wise groups of pre-activation data.

Further, FIG. 9 depicts one arrangement of depthwise weights and fused weights, wherein the depthwise weights are written to the first set of columns, and the fused weights are written to a second set of columns after the depthwise columns, but in other aspects, different arrangements could be configured. FIG. 9 depicts just one example.

Figure 10:
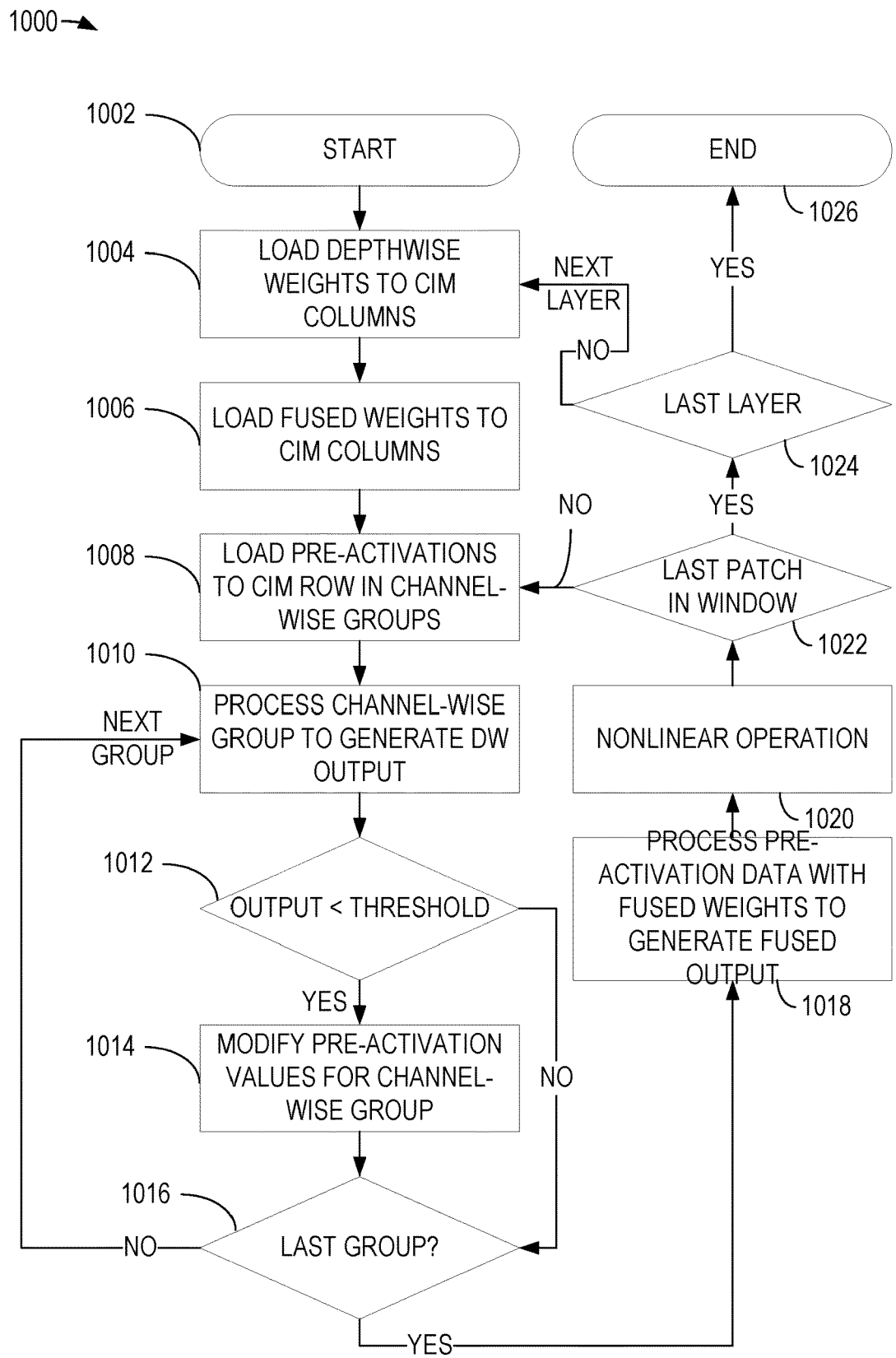
FIG. 10 depicts an example processing flow for performing depthwise separable convolution in a CIM without a DMAC.

Example Processing Flow for Performing Depthwise Separable Convolution in a CIM without a DMAC FIG. 10 depicts an example processing flow 1000 for performing depthwise separable convolution in a CIM without a DMAC.

Process 1000 begins at step 1002 where, for example, pre-activation data (e.g., for a convolutional neural network layer) is received for processing by a CIM array.

Process 1000 then proceeds to step 1004 where weights for a depthwise portion of a depthwise separable convolution (e.g., for a convolutional neural network layer) are loaded into CIM columns, such as the weights loaded into bitcells 906 in FIG. 9. In some aspects, as depicted in FIG. 9, the depthwise weights are loaded into the first BW columns of a CIM array, where BW is the bit width of the weights. For example, in FIG. 9, the weights are 2-bit and thus the first BW=2 columns of the CIM array are loaded with the depthwise weights.

Process 1000 then proceeds to step 1006 where fused weights are loaded into CIM columns, such as the weights loaded into bitcells 910 in FIG. 9. As above, the fusing of the weights may be performed offline, and thus is not depicted as a step in process 1000.

Process 1000 then proceeds to step 1008 where pre-activations are loaded into wordlines (rows) of the CIM array in channel-wise groups. For example, assume a 5×5×3 depthwise kernel, as depicted in FIG. 3A at 304A-C, then three channel-wise groups of input pre-activations comprising 5×5=25 bits are loaded into rows of the CIM array. So, for example, in FIG. 9, N=25 for each channel-wise group of pre-activations. Where the pre-activation data is multibit, then each wordline is loaded with one bit of the multibit pre-activation data in a time serial fashion.

Process 1000 then proceeds to step 1010 where a channel-wise group of pre-activation data is processed by the CIM array to generate depthwise output. For example, as depicted in FIG. 9, the output of bitcells 906 corresponding to the depthwise kernel may be accumulated by sequential accumulators 912. In some aspects, the accumulation is a voltage-type accumulation.

Process 1000 then proceeds to step 1012 where the depthwise output is compared to a threshold. For example, the accumulated voltage may be compared to a voltage threshold.

If at step 1012, the depthwise output is below the threshold, then the pre-activation values for the channel-wise group can modified. For example, the pre-activations can be set to zero and/or any buffer associated with the pre-activations can be cleared at step 1014.

For example, in FIG. 9, the pre-activations in input buffers 902 may be zeroed out by setting the associated gain blocks 904 to zero. In other words, the gain acts like a multiplication by zero in order to zero out the pre-activation values. Further, the wordlines (rows) associated with the current channel-wise group of wordlines may be disabled (e.g., "tristated") so that they do not contribute to subsequent processing with the fused weights, which beneficially saves processing power. This step has the equivalent effect of performing a nonlinear operation, such as a ReLU operation, on the depthwise output without having to actually perform the nonlinear operation, which may require data movement and further processing blocks, such as a DMAC. Thus, processing and memory efficiency is improved using the thresholding at step 1012 and pre-activation data adaptation at step 1014.

If at step 1012, the output is above the threshold, then process 1000 proceeds to step 1016 where it is determined if the currently processed channel-wise group is the last channel wise group. If not, then process 1000 returns to step 1010 and processes the next channel-wise group according to the same process as described above. If so, then process 1000 proceeds to step 1018.

At step 1018, the pre-activation data is processed by the fused weights stored in the CIM array. For example, the pre-activation data in input buffers 902 of FIG. 9 may be processed with the fused weights stored in bitcells 910 to generate fused weight output that is accumulated by sequential accumulators 916.

Note that the set of pre-activation data in this processing step may differ from that originally loaded in step 1008 because of the thresholding and clearing in steps 1012 and 1014. For example, certain pre-activations may be zeroed out as compared to their original values. Further, as above, certain rows may be disabled for processing at step 1018 based on the thresholding at step 1012.

Further, in some cases the pre-activation data and weight data loaded to a CIM array may not use all of the bitcells in the CIM array. In such cases, tiling may be used to activate or deactivate certain portions of the CIM array to save power. However, depending on the granularity of the tiling control available, there may be certain bitcells that are still active even after tiling control, but which do not have weight data for the current processing. In such cases, dummy weight data may be added to the bitcells (e.g., zero weights) so that any pre-activation data processed by the dummy weights does not affect the accumulations, and therefore the output.

The output of step 1018 is processed by a nonlinear operation at step 1020 to generate layer output (e.g., depthwise convolutional layer output). Note that various intermediate operations may be performed between the processing by the CIM in step 1018 and the nonlinear operation at step 1020, such as analog-to-digital conversion (e.g., via ADC 918 in FIG. 9), pooling, biasing, shifting, scaling (e.g., scaling block 920 in FIG. 9), and the like. The output (not depicted) of the nonlinear operation at step 1020 may be provided, for example, to an activation buffer for further processing (e.g., in another layer of a model) or for use by a host processing system.

Process 1000 then proceeds to step 1022 where it is determined whether the last patch of data within a convolution sliding window has been processed. If not, then process 1000 returns to step 1008 where the next patch of pre-activations in the convolution window are loaded. If so, then process proceeds to step 1024.

At step 1024, it is determined whether the last layer (e.g., the last convolutional layer of a neural network model) has been processed. If not, then process 1000 returns to step 1004 where a new layer's data may be processed as described above. If so, then the process ends at step 1026.

Note that FIG. 10 is just one example method, and other methods are possible with fewer, more, or alternative steps in accordance with the various aspects described herein. For example, certain steps may be performed in a different order in other aspects, such as the loading of weights and pre-activations in steps 1004-1008.

Reducing Range Compression to Improve CIM Accuracy

As described with respect to steps 1012 and 1014 in FIG. 10, the initial processing of pre-activation data with depthwise weights may result in various pre-activations being zeroed out and/or various wordlines of a CIM array being disabled for subsequent processing with fused weights. While this leads to improved energy efficiency during processing, it can also cause range compression for downstream ADCs, which can affect the range of the ADC output (e.g., the ADC quantization dynamic range is reduced).

One method for addressing ADC range compression is through offline pre-processing. For example, signal range can be calculated and scaled for quantization optimization (min and max and scale factor). In one aspect, an input gain (or shift) control block may be implemented, for example in a CIM glue logic block, and the input gain block can be used to adjust the input signal level based on comparator output. For example, an input gain control block could be added after comparator 914 in FIG. 9 in order to perform this control.

For, example, for a conventional convolutional neural network, a first column of weight data may be activated and the accumulated output may be compared to a threshold to determine an input gain shift number.

For a depthwise convolutional neural network, as described above, when the accumulated output for a channel-wise group of rows is below a threshold, then the pre-activation data may be zeroed out. When it is above the threshold, then an input gain shift number can be determined as in the case of a conventional convolutional neural network.

Another method for addressing ADC range compression is to arrange weights within the CIM such that the first S columns of weights represent the array statistics of the whole array. Then, the output of the first S columns can be used to determine the input gain shift value, which as above, may be implemented by a block after comparator 914 in FIG. 9 (as one example).

In some aspects, ADC dynamic range gain updates can be performed for every input patch of data, for every set

Figure 11:
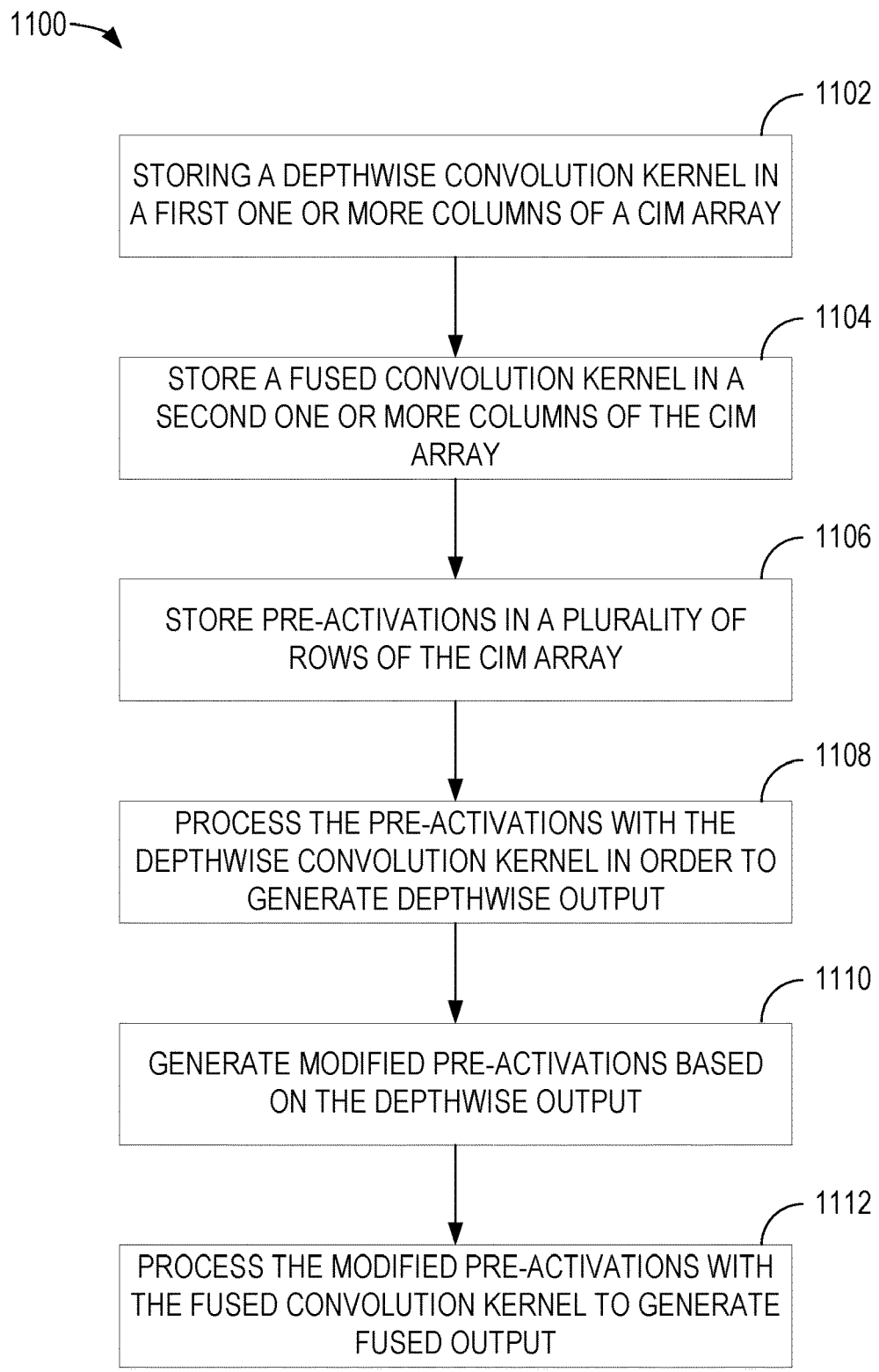
FIG. 11 depicts an example method for performing depthwise separable convolution in a CIM.

Example Method for Performing Depthwise Separable Convolution in a CIM without a DMAC FIG. 11 depicts an example method 1100 for performing depthwise separable convolution in a CIM without use of a DMAC.

Method 1100 begins at 1102 with storing a depthwise convolution kernel in a first one or more columns of a CIM array, such as depicted for example in bitcells 906 of FIG. 9.

Method 1100 then proceeds to step 1104 with storing a fused convolution kernel in a second one or more columns of the CIM array, such as depicted for example in bitcells 910 of FIG. 9.

Method 1100 then proceeds to step 1106 with storing pre-activations in input data buffers associated with a plurality of rows of the CIM array, such as in blocks 902 in FIG. 9.

In some aspects, the pre-activations may be loaded from an activation buffer, or a host processing system memory, in the host processing machine in which the CIM array is integrated.

Method 1100 then proceeds to step 1108 with processing the pre-activations with the depthwise convolution kernel in order to generate depthwise output, such as described above with respect to step 1010 of FIG. 10.

Method 1100 then proceeds to step 1110 with generating modified pre-activations based on the depthwise output, such as described above with respect to step 1014 of FIG. 10.

In some aspects, of method 1110, modifying the one or more of the pre-activations comprises setting a gain for the one or more pre-activations to zero, such as by action of the gain blocks 904 in FIG. 9.

Method 1100 then proceeds to step 1112 with processing the modified pre-activations with the fused convolution kernel to generate fused output, such as described above with respect to step 1018 of FIG. 10.

In some aspects, method 1100 further includes comparing the depthwise output to a threshold, such as described above in FIG. 10 with respect to step 1012.

In some aspects of method 1100, modifying the one or more of the pre-activations comprises disabling the rows of the CIM array (e.g., tristating the rows) associated with the one or more of the pre-activations.

In some aspects of method 1100, the pre-activations comprise one channel-wise group of pre-activations of a plurality of channel-wise groups of pre-activations. More generally, method 1100 may iterate through a plurality of channel-wise groups of pre-activation data until all depth-wise channels are processed, such as described with respect to FIG. 10. This channel-wise grouping allows for modifying pre-activations based on channel-specific data, which may beneficially lead to increased sparsity in the modified pre-activation data and thereby more power savings during processing of an entire layer's pre-activation data.

In some aspects of method 1100, processing the modified pre-activations with the fused convolution kernel to generate fused output is performed after each channel-wise group of pre-activations of the plurality of channel-wise groups of pre-activations has been processed by the depthwise kernel.

In some aspects, method 1100 further includes converting the fused output to digital output data via an analog-to-digital converter (ADC), such as described above with respect to ADC 918 in FIG. 9.

In some aspects, method 1100 further includes processing the digital output data with a nonlinear operation to generate activation data.

Figure 12:
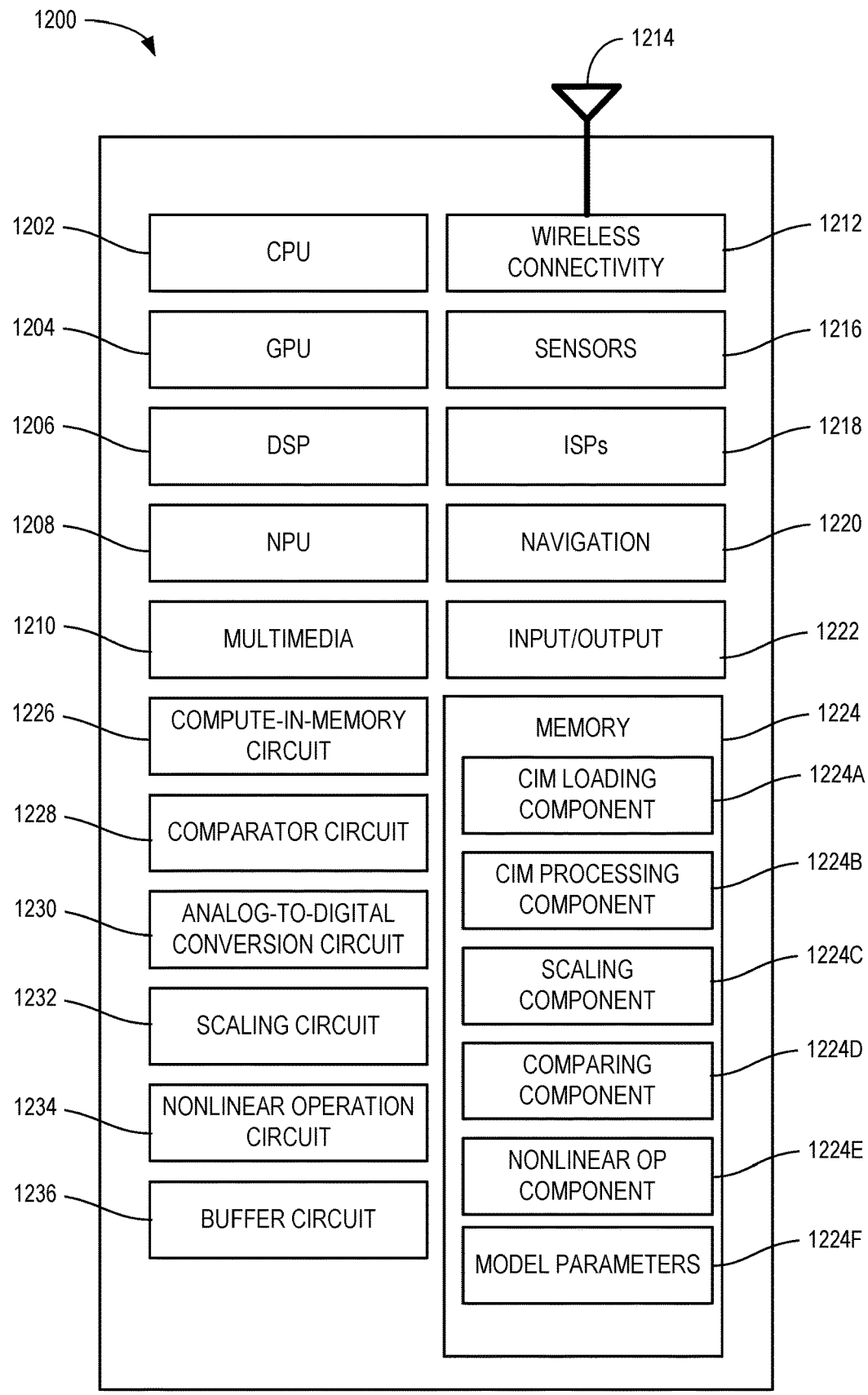
FIG. 12 depicts an example processing system for performing convolutional neural network processing.

In some aspects, method 1100 further includes providing the activation data to a host processing system, such as the processing system described with respect to FIG. 12.

In some aspects, method 1100 further includes providing the activation data to an activation buffer for processing another layer of a model using the CIM array. For example, the activation data may be used in the next layer after the "NO" branch of step 1022 in FIG. 10.

In some aspects, method 1100 further includes scaling the digital output data prior to processing the digital output data with the nonlinear operation, such as described above with respect to scaling block 920 in FIG. 9.

In some aspects, method 1100 further includes fusing the depthwise convolution kernel and a pointwise convolution kernel in order to generate the fused convolution kernel.

In some aspects of method 1100, the CIM array comprises a plurality of static random access memory (SRAM) bitcells. In some aspects, one or more of the SRAM bitcells may be configurable between and AND operational logic and an XNOR operational logic, such as described above with respect to FIGS. 5A and 5B.

In some aspects, method 1100 further includes scaling the one or more of the pre-activations to reduce range compression of the fused output.

In some aspects of method 1100, scaling is performed only on the one or more of the pre-activations having a depthwise output greater than the threshold.

Note that FIG. 11 is just one example method, and other methods are possible with fewer, more, or alternative steps in accordance with the various aspects described herein. For example, certain steps may be performed in a different order in other aspects, such as the storing of kernels and pre-activations in steps 1102-1106.

Example Processing System for Performing Convolutional Neural Network Processing FIG. 12 depicts an example processing system 1200 for performing convolutional neural network processing, such as described herein for example with respect to FIGS. 8-11.

Processing system 1200 includes a central processing unit (CPU) 1202, which in some examples may be a multi-core CPU. Instructions executed at the CPU 1202 may be loaded, for example, from a program memory associated with the CPU 1202 or may be loaded from a memory partition 1224.

Processing system 1200 also includes additional processing components tailored to specific functions, such as a graphics processing unit (GPU) 1204, a digital signal processor (DSP) 1206, a neural processing unit (NPU) 1208, a multimedia processing unit 1210, a multimedia processing unit 1210, and a wireless connectivity component 1212.

An NPU, such as 1208, is generally a specialized circuit configured for implementing all the necessary control and arithmetic logic for executing machine learning algorithms, such as algorithms for processing artificial neural networks (ANNs), deep neural networks (DNNs), random forests (RFs), and the like. An NPU may sometimes alternatively be referred to as a neural signal processor (NSP), tensor processing units (TPU), neural network processor (NNP), intelligence processing unit (IPU), vision processing unit (VPU), or graph processing unit.

NPUs, such as 1208, are configured to accelerate the performance of common machine learning tasks, such as image classification, machine translation, object detection, and various other predictive models. In some examples, a plurality of NPUs may be instantiated on a single chip, such as a system on a chip (SoC), while in other examples they may be part of a dedicated neural-network accelerator.

NPUs may be optimized for training or inference, or in some cases configured to balance performance between both. For NPUs that are capable of performing both training and inference, the two tasks may still generally be performed independently.

NPUs designed to accelerate training are generally configured to accelerate the optimization of new models, which is a highly compute-intensive operation that involves inputting an existing dataset (often labeled or tagged), iterating over the dataset, and then adjusting model parameters, such as weights and biases, in order to improve model performance. Generally, optimizing based on a wrong prediction involves propagating back through the layers of the model and determining gradients to reduce the prediction error.

NPUs designed to accelerate inference are generally configured to operate on complete models. Such NPUs may thus be configured to input a new piece of data and rapidly process it through an already trained model to generate a model output (e.g., an inference).

In one implementation, NPU 1208 is a part of one or more of CPU 1202, GPU 1204, and/or DSP 1206.

In some examples, wireless connectivity component 1212 may include subcomponents, for example, for third generation (3G) connectivity, fourth generation (4G) connectivity (e.g., 4G LTE), fifth generation connectivity (e.g., 5G or NR), Wi-Fi connectivity, Bluetooth connectivity, and other wireless data transmission standards. Wireless connectivity processing component 1212 is further connected to one or more antennas 1214.

Processing system 1200 may also include one or more sensor processing units 1216 associated with any manner of sensor, one or more image signal processors (ISPs) 1218 associated with any manner of image sensor, and/or a navigation processor 1220, which may include satellite-based positioning system components (e.g., GPS or GLO-NASS) as well as inertial positioning system components.

Processing system 1200 may also include one or more input and/or output devices 1222, such as screens, touch-sensitive surfaces (including touch-sensitive displays), physical buttons, speakers, microphones, and the like.

In some examples, one or more of the processors of processing system 1200 may be based on an ARM or RISC-V instruction set.

Processing system 1200 also includes memory 1224, which is representative of one or more static and/or dynamic memories, such as a dynamic random access memory, a flash-based static memory, and the like. In this example, memory 1224 includes computer-executable components, which may be executed by one or more of the aforementioned processors of processing system 1200.

In particular, in this example, memory 1224 includes CIM loading component 1224A, CIM processing component 1224B, scaling component 1224C, comparing component 1224D, nonlinear operation component 1224E, and model parameters 1224F. The depicted components, and others not depicted, may be configured to perform various aspects of the methods described herein.

Processing system 1200 further comprises compute-in-memory (CIM) circuit 1226, such as described above, for example, with respect to FIGS. 9. Further, the bitcells depicted in FIG. 9 may be as described in FIGS. 5A and 5B in various aspects.

Processing system 1200 further comprises comparator circuit 1228, such as described above with respect to FIG. 9.

Processing system 1200 further comprises analog-to-digital converter (ADC) circuit 1230, such as described above, for example, with respect to FIGS. 9.

Processing system 1200 further comprises scaling circuit 1232, such as described above, for example, with respect to FIG. 9.

Processing system 1200 further comprises nonlinear operation circuit 1234, such as described above, for example, with respect to FIG. 9.

Processing system 1200 further comprises buffer circuit 1234, such as an activation buffer described above, for example, with respect to FIG. 10.

Generally, processing system 1200 and/or components thereof may be configured to perform the methods described herein.

Notably, in other aspects, aspects of processing system 1200 may be omitted, such as where processing system 1200 is a server computer or the like. For example, multimedia component 1210, wireless connectivity 1212, sensors 1216, ISPs 1218, and/or navigation component 1220 may be omitted in other aspects. Further, aspects of processing system 1200 maybe distributed, such as training a model and using the model to generate inferences, such as user verification predictions.

Example Clauses

Implementation examples are described in the following numbered clauses:

Clause 1: An apparatus, comprising: a compute-in-memory (CIM) array configured to: store a depthwise convolution kernel in a first one or more columns of the CIM array; store a fused convolution kernel in a second one or more columns of the CIM array; store pre-activations in a plurality of rows of the CIM array; process the pre-activations with the depthwise convolution kernel in order to generate depthwise output; generate modified pre-activations based on the depthwise output; and process the modified pre-activations with the fused convolution kernel to generate fused output.

Clause 2: The apparatus of Clause 1, further comprising: a comparator configured to compare the depthwise output to a threshold; and a gain block connected to each respective row of the plurality of rows of the CIM array and configured to modify a pre-activation stored in its respective row if the depthwise output is less than the threshold.

Clause 3: The apparatus of any one of Clauses 1-2, wherein: the pre-activations correspond to one channel-wise group of pre-activation data, and the depthwise output corresponds to one channel of the depthwise convolution kernel.

Clause 4: The apparatus of any one of Clauses 1-3, wherein in order to modify one or more of the pre-activations based on the depthwise output, the CIM array is further configured to set the one or more pre-activations values to zero.

Clause 5: The apparatus of any one of Clauses 1-4, wherein the CIM array is further configured to disable one or more rows of the CIM array associated with the modified pre-activations.

Clause 6: The apparatus of any one of Clauses 1-5, further comprising a fusion block configured to fuse the depthwise convolution kernel and a pointwise convolution kernel in order to generate the fused convolution kernel.

Clause 7: The apparatus of any one of Clauses 1-6, further comprising: a sequential accumulator connected to each column of the first one or more columns of the CIM array in which the depthwise convolution kernel is stored; and a comparator configured to receive accumulated output from at least one sequential accumulator connected to the first one or more columns of the CIM array.

Clause 8: The apparatus of any one of Clauses 1-7, further comprising: a sequential accumulator connected to each column of the second one or more columns of the CIM array in which the fused convolution kernel is stored; an analog-to-digital converter (ADC) configured to receive accumulated output from at least one sequential accumulator connected to the second one or more columns of the CIM array and output digital data; and a nonlinear operation block configured to process the digital data and generate activation data.

Clause 9: The apparatus of Clause 8, further comprising a scaling block configured to scale the digital data output from the ADC from a first bit width to a second bit width prior to providing the digital data to the nonlinear operation block.

Clause 10: The apparatus of any one of Clauses 1-9, wherein the CIM array comprises a plurality of static random access memory (SRAM) bitcells.

Clause 11: A method, comprising: storing a depthwise convolution kernel in a first one or more columns of a CIM array; storing a fused convolution kernel in a second one or more columns of the CIM array; storing pre-activations in one or more input data buffers associated with a plurality of rows of the CIM array; processing the pre-activations with the depthwise convolution kernel in order to generate depthwise output; modifying one or more of the pre-activations based on the depthwise output to generate modified pre-activations; and processing the modified pre-activations with the fused convolution kernel to generate fused output.

Clause 12: The method of Clause 11, further comprising: comparing the depthwise output to a threshold, wherein modifying the one or more of the pre-activations comprises setting a gain for the one or more pre-activations to zero.

Clause 13: The method of any one of Clauses 11-12, wherein modifying the one or more of the pre-activations comprises disabling the rows of the CIM array associated with the one or more of the pre-activations.

Clause 14: The method of any one of Clauses 11-13, wherein the pre-activations comprise one channel-wise group of pre-activations of a plurality of channel-wise groups of pre-activations.

Clause 15: The method of Clause 14, wherein processing the modified pre-activations with the fused convolution kernel to generate fused output is performed after each channel-wise group of pre-activations of the plurality of channel-wise groups of pre-activations has been processed by the depthwise convolution kernel.

Clause 16: The method of any one of Clauses 11-15, further comprising converting the fused output to digital output data via an analog-to-digital converter (ADC).

Clause 17: The method of Clause 16, further comprising processing the digital output data with a nonlinear operation to generate activation data.

Clause 18: The method of Clause 17, further comprising providing the activation data to a host processing system.

Clause 19: The method of Clause 17, further comprising providing the activation data to an activation buffer for processing another layer of a model using the CIM array.

Clause 20: The method of any one of Clauses 17-19, further comprising scaling the digital output data prior to processing the digital output data with the nonlinear operation.

Clause 21: The method of any one of Clauses 11-20, further comprising: fusing the depthwise convolution kernel and a pointwise convolution kernel in order to generate the fused convolution kernel.

Clause 22: The method of any one of Clauses 11-21, wherein the CIM array comprises a plurality of static random access memory (SRAM) bitcells.

Clause 23: The method of any one of Clauses 12-22, further comprising scaling the one or more of the pre-activations to reduce range compression of the fused output.

Clause 24: The method of Clause 23, wherein scaling is performed only on the one or more of the pre-activations having a depthwise output greater than the threshold.

Clause 25: A processing system, comprising: a memory comprising computer-executable instructions; one or more processors configured to execute the computer-executable instructions and cause the processing system to perform a method in accordance with any one of Clauses 11-24.

Clause 26: A processing system, comprising means for performing a method in accordance with any one of Clauses 11-24.

Clause 27: A non-transitory computer-readable medium comprising computer-executable instructions that, when executed by one or more processors of a processing system, cause the processing system to perform a method in accordance with any one of Clauses 11-24.

Clause 28: A computer program product embodied on a computer-readable storage medium comprising code for performing a method in accordance with any one of Clauses 11-24.

Additional Considerations

The preceding description is provided to enable any person skilled in the art to practice the various aspects described herein. The examples discussed herein are not limiting of the scope, applicability, or aspects set forth in the claims. Various modifications to these aspects will be readily apparent to those skilled in the art, and the generic principles defined herein may be applied to other aspects. For example, changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

As used herein, the word "exemplary" means "serving as an example, instance, or illustration." Any aspect described herein as "exemplary" is not necessarily to be construed as preferred or advantageous over other aspects.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

The following claims are not intended to be limited to the aspects shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112(f) unless the element is expressly recited using the phrase "means for" or, in the case of a method claim, the element is recited using the phrase "step for." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. An apparatus, comprising:
   a compute-in-memory (CIM) array configured to:
   store a depthwise convolution kernel in a first one or more columns of the CIM array;
   store a fused convolution kernel in a second one or more columns of the CIM array;
   store pre-activations in a plurality of rows of the CIM array;
   process the pre-activations with the depthwise convolution kernel in order to generate depthwise output;
   modify one or more of the pre-activations based on the depthwise output to generate modified pre-activations; and
   process the modified pre-activations with the fused convolution kernel to generate fused output.

2. The apparatus of claim 1, further comprising:
   a comparator configured to compare the depthwise output to a threshold; and
   a gain circuit connected to each respective row of the plurality of rows of the CIM array and configured to modify a pre-activation stored in its respective row if the depthwise output is less than the threshold.

3. The apparatus of claim 1, wherein:
   the pre-activations correspond to one channel-wise group of pre-activation data, and
   the depthwise output corresponds to one channel of the depthwise convolution kernel.

4. The apparatus of claim 1, wherein in order to modify the one or more of the pre-activations based on the depthwise output, the CIM array is further configured to set the one or more of the pre-activations values to zero.

5. The apparatus of claim 1, wherein the CIM array is further configured to disable one or more rows of the CIM array associated with the modified pre-activations.

6. The apparatus of claim 1, further comprising a fusion circuit configured to fuse the depthwise convolution kernel and a pointwise convolution kernel in order to generate the fused convolution kernel.

7. The apparatus of claim 1, further comprising:
   a sequential accumulator connected to each column of the first one or more columns of the CIM array in which the depthwise convolution kernel is stored; and
   a comparator configured to receive accumulated output from at least one sequential accumulator connected to the first one or more columns of the CIM array.

8. The apparatus of claim 1, further comprising:
   a sequential accumulator connected to each column of the second one or more columns of the CIM array in which the fused convolution kernel is stored;
   an analog-to-digital converter (ADC) configured to receive accumulated output from at least one sequential accumulator connected to the second one or more columns of the CIM array and output digital data; and
   a nonlinear operation circuit configured to process the digital data and generate activation data.

9. The apparatus of claim 8, further comprising a scaling circuit configured to scale the digital data output from the ADC from a first bit width to a second bit width prior to providing the digital data to the nonlinear operation circuit.

10. The apparatus of claim 1, wherein the CIM array comprises a plurality of static random access memory (SRAM) bitcells.

11. A method, comprising:
    storing a depthwise convolution kernel in a first one or more columns of a CIM array;
    storing a fused convolution kernel in a second one or more columns of the CIM array;
    storing pre-activations in one or more input data buffers associated with a plurality of rows of the CIM array;
    processing the pre-activations with the depthwise convolution kernel in order to generate depthwise output;
    modifying one or more of the pre-activations based on the depthwise output to generate modified pre-activations; and
    processing the modified pre-activations with the fused convolution kernel to generate fused output.

12. The method of claim 11, further comprising: comparing the depthwise output to a threshold, wherein modifying the one or more of the pre-activations comprises setting a gain for the one or more of the pre-activations to zero.

13. The method of claim 11, wherein modifying the one or more of the pre-activations comprises disabling the rows of the CIM array associated with the one or more of the pre-activations.

14. The method of claim 11, wherein the pre-activations comprise one channel-wise group of pre-activations of a plurality of channel-wise groups of pre-activations.

15. The method of claim 14, wherein processing the modified pre-activations with the fused convolution kernel to generate fused output is performed after each channel-wise group of pre-activations of the plurality of channel-wise groups of pre-activations has been processed by the depthwise convolution kernel.

16. The method of claim 11, further comprising converting the fused output to digital output data via an analog-to-digital converter (ADC).

17. The method of claim 16, further comprising processing the digital output data with a nonlinear operation to generate activation data.

18. The method of claim 17, further comprising providing the activation data to a host processing system.

19. The method of claim 17, further comprising providing the activation data to an activation buffer for processing another layer of a model using the CIM array.

20. The method of claim 17, further comprising scaling the digital output data prior to processing the digital output data with the nonlinear operation.

21. The method of claim 11, further comprising: fusing the depthwise convolution kernel and a pointwise convolution kernel in order to generate the fused convolution kernel.

22. The method of claim 11, wherein the CIM array comprises a plurality of static random access memory (SRAM) bitcells.

23. The method of claim 12, further comprising scaling the one or more of the pre-activations to reduce range compression of the fused output.

24. The method of claim 23, wherein the scaling is performed only on the one or more of the pre-activations having a depthwise output greater than the threshold.

25. A non-transitory computer-readable medium comprising instructions that, when executed by a processor of a processing system, cause the processing system to perform a method, the method comprising:
   storing a depthwise convolution kernel in a first one or more columns of a CIM array;
   storing a fused convolution kernel in a second one or more columns of the CIM array;
   storing pre-activations in one or more input data buffers associated with a plurality of rows of the CIM array;
   processing the pre-activations with the depthwise convolution kernel in order to generate depthwise output;
   modifying one or more of the pre-activations based on the depthwise output to generate modified pre-activations; and
   processing the modified pre-activations with the fused convolution kernel to generate fused output.

26. The non-transitory computer-readable medium of claim 25, wherein the method further comprises: comparing the depthwise output to a threshold, wherein modifying the one or more of the pre-activations comprises setting a gain for the one or more of the pre-activations to zero.

27. The non-transitory computer-readable medium of claim 25, wherein modifying the one or more of the pre-activations comprises disabling the rows of the CIM array associated with the one or more of the pre-activations.

28. The non-transitory computer-readable medium of claim 25, wherein the pre-activations comprise one channel-wise group of pre-activations of a plurality of channel-wise groups of pre-activations.

29. The non-transitory computer-readable medium of claim 28, wherein processing the modified pre-activations with the fused convolution kernel to generate fused output is performed after each channel-wise group of pre-activations of the plurality of channel-wise groups of pre-activations has been processed by the depthwise convolution kernel.

* * * * *